US010177770B2

(12) United States Patent
Yonezawa

(10) Patent No.: US 10,177,770 B2
(45) Date of Patent: Jan. 8, 2019

(54) CIRCUIT DEVICE, OSCILLATOR, ELECTRONIC APPARATUS, AND VEHICLE

(71) Applicant: SEIKO EPSON CORPORATION, Tokyo (JP)

(72) Inventor: Takemi Yonezawa, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 217 days.

(21) Appl. No.: 15/384,885

(22) Filed: Dec. 20, 2016

(65) Prior Publication Data

US 2017/0194966 A1 Jul. 6, 2017

(30) Foreign Application Priority Data

Jan. 6, 2016 (JP) .................. 2016-001303
Jul. 12, 2016 (JP) .................. 2016-137666

(51) Int. Cl.
H03L 1/02 (2006.01)
H03B 5/36 (2006.01)
H03L 1/00 (2006.01)
H03L 1/04 (2006.01)
H03L 7/085 (2006.01)
H03L 7/093 (2006.01)
H03L 7/099 (2006.01)
H03L 7/14 (2006.01)

(52) U.S. Cl.
CPC ............. *H03L 1/025* (2013.01); *H03B 5/362* (2013.01); *H03B 5/368* (2013.01); *H03L 1/00* (2013.01); *H03L 1/026* (2013.01); *H03L 1/028* (2013.01); *H03L 1/04* (2013.01); *H03L 7/085* (2013.01); *H03L 7/093* (2013.01); *H03L 7/099* (2013.01); *H03L 7/14* (2013.01); *H03B 2200/004* (2013.01); *H03B 2200/0018* (2013.01); *H03L 2207/50* (2013.01)

(58) Field of Classification Search
CPC ...................................... H03L 1/025
USPC ........................................ 331/66
See application file for complete search history.

(56) References Cited

U.S. PATENT DOCUMENTS 5,307,503 A * 4/1994 Okada ............... H01L 23/49503
257/E23.037
6,603,466 B1 * 8/2003 Sakaguchi ........... G09G 3/3688
345/100

FOREIGN PATENT DOCUMENTS

JP 2015-082815 A 4/2015

* cited by examiner

Primary Examiner — Joseph Chang
(74) Attorney, Agent, or Firm — Oliff PLC

(57) ABSTRACT

A circuit device includes a digital interface, a processor, an oscillation signal generation circuit, a clock signal generation circuit that generates a clock signal having frequency obtained through multiplication of a frequency of the oscillation signal, and terminal groups of the digital interface and the clock signal generation circuit. The terminal group of the digital interface is disposed in a first region along a first side of the circuit device, and the terminal group of the clock signal generation circuit is disposed in any one of second, third and fourth regions of the circuit device.

16 Claims, 21 Drawing Sheets

| PLLLOCK | KFEN | $\hat{x}(k)$ |
|---|---|---|
| 0 | 0 | DFCI (THROUGH OUTPUT) |
| 0 | 1 | HOLD PREVIOUS OUTPUT STATE |
| 1 | 0 | DFCI (THROUGH OUTPUT) |
| 1 | 1 | TRUE VALUE ESTIMATION PROCESS (KARMAN FILTER PROCESS) |

CIRCUIT DEVICE, OSCILLATOR, ELECTRONIC APPARATUS, AND VEHICLE

CROSS-REFERENCE TO RELATED APPLICATIONS

The present application claims priority to Japanese Patent Application JP 2016-001303, filed Jan. 6, 2016, and JP 2016-137666, filed Jul. 12, 2016, the entire disclosure of which are hereby incorporated by reference herein.

BACKGROUND

1. Technical Field

Various embodiments of the present invention relate to a circuit device, an oscillator, an electronic apparatus, and a vehicle.

2. Related Art

In the related art, there is an oscillator such as an oven controlled crystal oscillator (OCXO) or a temperature compensated crystal oscillator (TCXO). For example, the OCXO is used as a reference signal source in a base station, a network router, a measurement apparatus, and the like. There is a need for a highly accurate oscillation frequency in an oscillator such as the OCXO or the TCXO.

Regarding the related art of such an oscillator, there is a technique disclosed in JP-A-2015-82815. In this related art, aging correction is performed on an oscillation frequency in order to obtain a highly accurate oscillation frequency. Specifically, there are provided a storage which stores correspondence relationship information between a correction value of a control voltage for an oscillation frequency and the elapsed time, and an elapsed time measurer. Aging correction is performed on the basis of the correspondence relationship information between a correction value and the elapsed time, stored in the storage, and the elapsed time measured by the elapsed time measurer.

As mentioned above, there is a need for a highly accurate oscillation frequency of an oscillation signal in an oscillator such as the OCXO or the TCXO. A clock signal having a frequency which is different from an oscillation frequency may be required to be supplied by an external system.

On the other hand, a digital interface may be provided in a circuit device in order to cope with an application such as forming a loop of a PLL circuit by using an external frequency control data generator of the circuit device.

However, if such a digital interface is provided, it has been proved that there is a concern that the accuracy of a clock signal or an oscillation signal is reduced due to phase noise or the like caused by communication noise in the digital interface.

SUMMARY

An advantage of some aspects of the invention is to provide a circuit device, an oscillator, an electronic apparatus, a vehicle, and the like, capable of generating a clock signal or the like with reduced noise.

An aspect of the invention relates to a circuit device including a digital interface; a processor that receives data from an external device via the digital interface and performs a signal process on the data; an oscillation signal generation circuit that generates an oscillation signal having an oscillation frequency set by frequency control data by using the frequency control data from the processor and a resonator; a clock signal generation circuit that includes at least a phase comparator and generates a clock signal having a frequency which is obtained through multiplication of the oscillation frequency of the oscillation signal; a first terminal group for connection of the digital interface; a second terminal group for connection of an oscillation circuit of the oscillation signal generation circuit; and a third terminal group for connection of the clock signal generation circuit, in which, in a case where a side intersecting a first side of the circuit device is set to a second side, a side opposing the first side is set to a third side, and a side opposing the second side is set to a fourth side, the first terminal group is disposed in a first terminal region along the first side, and the third terminal group is disposed in any one of a second terminal region along the second side, a third terminal region along the third side, and a fourth terminal region along the fourth side.

In the aspect of the invention, data is input to the processor from the external device via the digital interface, and a signal process is performed on the data. An oscillation signal is generated by the oscillation signal generation circuit by using frequency control data from the processor and the resonator, and a clock signal having a frequency obtained through multiplication of an oscillation frequency of the oscillation signal is generated by the clock signal generation circuit. In the aspect of the invention, the first terminal group for connection of the digital interface is disposed in the first terminal region along the first side of the circuit device. On the other hand, the third terminal group for connection of the clock signal generation circuit is disposed in any one of the second, third and fourth terminal regions. In the above-described way, the first terminal group for connection of the digital interface and the third terminal group for connection of the clock signal generation circuit can be separated from each other. Consequently, it is possible to reduce phase noise or the like generated in a clock signal due to communication noise or the like in the digital interface, and thus to implement a circuit device which can generate a clock signal or the like with reduced noise.

In the aspect of the invention, the second terminal group may be disposed in one of the second terminal region and the third terminal region, and the third terminal group may be disposed in the other of the second terminal region and the third terminal region.

With this configuration, the first terminal group for connection of the digital interface and the second terminal group for connection of the oscillation circuit, or the first terminal group for connection of the digital interface and the third terminal group for connection of the clock signal generation circuit can be separated from each other. Consequently, it is possible to reduce phase noise or the like generated in a clock signal or an oscillation signal due to communication noise or the like in the digital interface.

In the aspect of the invention, the first side may be a short side of the circuit device, and the first terminal group may be disposed in the first terminal region along the first side which is a short side.

With this configuration, the first terminal group and other terminal groups can be separated from each other by, for example, a distance corresponding to a length of a long side of the circuit device, and thus it is possible to reduce phase noise or the like caused by communication noise or the like in the digital interface.

In the aspect of the invention, in a case where a distance between the first terminal group and the second terminal group is indicated by L12, a distance between the first terminal group and the third terminal group is indicated by L13, and a distance between the second terminal group and the third terminal group is indicated by L23, at least one of the distances L12 and L13 may be longer than the distance L23.

With this configuration, the distance L12 between the first terminal group and the second terminal group or the distance L13 between the first terminal group and the third terminal group can be lengthened, and thus phase noise can be reduced.

In the aspect of the invention, frequency control data from an external frequency control data generator which compares an input signal based on the oscillation signal with a reference signal may be input to the processor via the first terminal group and the digital interface, and the oscillation signal generation circuit may generate the oscillation signal on the basis of the frequency control data which is input from the external frequency control data generator via the processor.

With this configuration, it is possible to generate an oscillation signal having an oscillation frequency set by frequency control data from the external frequency control data generator by effectively using the external frequency control data generator provided outside the circuit device.

In the aspect of the invention, the circuit device may further include a phase comparator that compares a phase of an input signal based on the oscillation signal with a phase of the reference signal, and the oscillation signal generation circuit may generate the oscillation signal on the basis of the frequency control data which is input from the external frequency control data generator via the processor in a first mode, and may generate the oscillation signal on the basis of the frequency control data which is input from the phase comparator via the processor in a second mode.

With this configuration, it is possible to cope with both of cases where an external system includes and does not include the external frequency control data generator and thus to improve convenience.

In the aspect of the invention, the digital interface may be a 2-wire, 3-wire, or 4-wire serial interface circuit including a serial data line and a serial clock line.

With this configuration, in a case where an external device includes the 2-wire, 3-wire, or 4-wire serial interface circuit, data can be input to the processor from the external device by performing a 2-wire, 3-wire, or 4-wire serial interface process with the external device.

In the aspect of the invention, in a case where a direction directed from the first side toward the third side is set to a first direction, the processor may be disposed on the first direction side of the first terminal group.

With this configuration, data which is input from an external device by using terminals of the first terminal group can be input to the processor via the digital interface along a short signal path. Consequently, it is possible to reduce an adverse effect exerted by communication noise generated in the digital interface.

In the aspect of the invention, the second terminal group may be disposed in the second terminal region, the third terminal group may be disposed in the third terminal region, and, in a case where an opposite direction to the first direction is set to a second direction, the clock signal generation circuit may be disposed on the second direction side of the third terminal group.

With this configuration, an output signal from or an input signal to the clock signal generation circuit can be output or input along a short signal path between the clock signal generation circuit and terminals of the third terminal group. Consequently, it is possible to reduce an adverse effect exerted by clock noise generated in the clock signal generation circuit.

In the aspect of the invention, the processor may be disposed between the first terminal region and the clock signal generation circuit.

With this configuration, the processor and the clock signal generation circuit are interposed between the first terminal group in the first terminal region and the third terminal group in the third terminal region. Therefore, as a distance between the first terminal group and the third terminal group, at least a distance corresponding to a width of the processor and a width of the clock signal generation circuit can be secured, and thus it is possible to reduce an adverse effect exerted by communication noise generated in the digital interface.

In the aspect of the invention, the oscillation circuit may be disposed between the processor and the clock signal generation circuit.

With this configuration, the processor, the oscillation circuit, and the clock signal generation circuit are interposed between the first terminal group in the first terminal region and the third terminal group in the third terminal region. Therefore, as a distance between the first terminal group and the third terminal group, at least a distance corresponding to the width of the processor, a width of the oscillation circuit, and the width of the clock signal generation circuit can be secured, and thus it is possible to reduce an adverse effect exerted by communication noise generated in the digital interface.

In the aspect of the invention, in a case where a direction directed from the second side toward the fourth side is set to a third direction, the oscillation circuit may be disposed on the third direction side of the second terminal group.

With this configuration, the oscillation circuit and terminals of the second terminal group can be connected to each other via a signal line along a short path, and thus it is possible to reduce an adverse effect exerted by parasitic capacitance or the like of the signal line.

In the aspect of the invention, the resonator may be an oven type resonator having a thermostatic oven, and a fourth terminal group including an oven control terminal of the oven type resonator may be disposed in the fourth terminal region along the fourth side.

With this configuration, the fourth terminal group including the oven control terminal can be disposed by effectively using the fourth terminal region of the circuit device.

In the aspect of the invention, the circuit device may further include an oven control circuit that is connected to the oven control terminal and performs oven control on the oven type resonator, and, in a case where a direction directed from the fourth side toward the second side is set to a fourth direction, the oven control circuit may be disposed on the fourth direction side of the fourth terminal region.

With this configuration, the oven control circuit and the oven control terminal of the fourth terminal group can be connected to each other along a short signal path, and thus it is possible to realize more appropriate oven control.

In the aspect of the invention, the oscillation circuit may be disposed between the oven control circuit and the second terminal region.

Consequently, the oven control circuit and the oscillation circuit can be disposed by effectively using a region between the fourth terminal region and the second terminal region, and thus it is possible to simultaneously realize improvement of layout efficiency and a reduction of noise.

In the aspect of the invention, the processor may perform a process of estimating a true value of the frequency control data through a Karman filter process, and may perform aging correction on the frequency control data on the basis of the estimated true value.

With this configuration, it is possible to realize aging correction in which the influence of observation noise or system noise is taken into consideration, and thus to improve the accuracy of the aging correction.

Another aspect of the invention relates to an oscillator including any of the circuit devices described above; and the resonator.

Still another aspect of the invention relates to an electronic apparatus including any of the circuit devices described above.

Yet another aspect of the invention relates to a vehicle including any of the circuit devices described above.

BRIEF DESCRIPTION OF THE DRAWINGS

Various embodiments of the invention will be described with reference to the accompanying drawings, wherein like numbers reference like elements.

DESCRIPTION OF EXEMPLARY EMBODIMENTS

Hereinafter, one or more embodiments of the invention will be described in detail. The one or more embodiment described below are not intended to improperly limit the content of the invention disclosed in the appended claims, and all constituent elements described in the one or more embodiments are not essential as solving means of the all of the embodiments.

1. Configuration of Circuit Device

Figure 1:
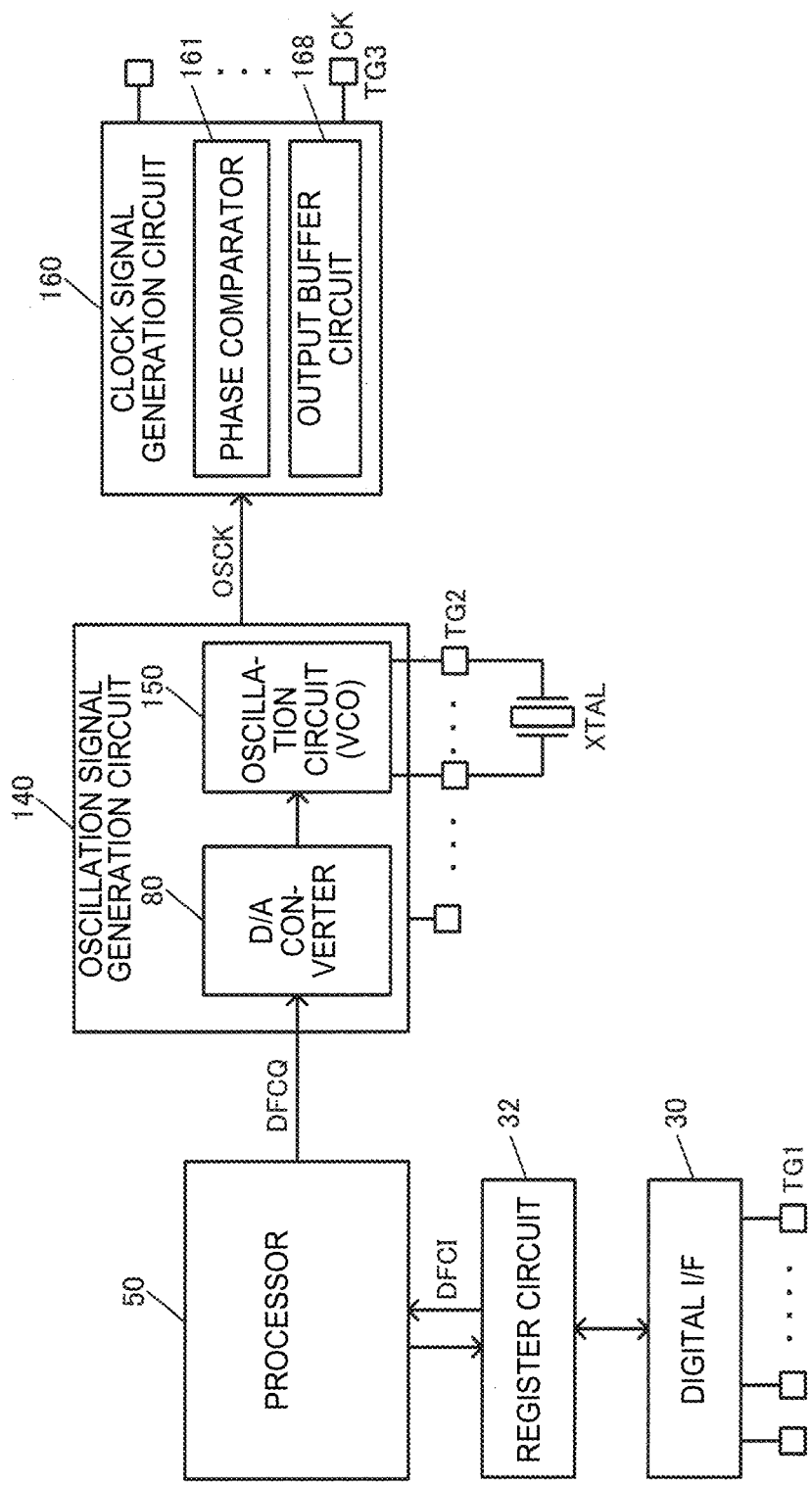
FIG. 1 is a diagram illustrating a fundamental configuration example of a circuit device according to an embodiment of the invention.

FIG. 1 illustrates a fundamental circuit configuration of a circuit device of the present embodiment. As illustrated in FIG. 1, the circuit device of the present embodiment includes a digital interface 30, a processor 50, an oscillation signal generation circuit 140, a clock signal generation circuit 160, and first, second, and third terminal groups TG1, TG2 and TG3. The circuit device may include a register circuit 32. A configuration of the circuit device is not limited to the configuration illustrated in FIG. 1, and may be variously modified by omitting some constituent elements (for example, the clock signal generation circuit) or adding other constituent elements thereto.

The digital interface (interface) 30 is a circuit which performs an interface process between the circuit device and an external device (a microcomputer, a controller, or the like). For example, the digital interface 30 is an interface for receiving data (digital data or a digital signal) from an external device or outputting data to the external device. Data is input to the processor 50 from an external device via the digital interface 30. For example, data is input from an external device via the register circuit 32. The processor 50 performs various signal processes on the basis of input data.

The digital interface 30 may be implemented by a circuit performing a serial interface process. For example, the digital interface 30 may be implemented by a 2-wire, 3-wire, or 4-wire serial interface circuit including a serial data line and a serial clock line. In other words, an interface process in the digital interface 30 may be realized on the basis of a synchronous serial communication method using a serial clock line and a serial data line. For example, the digital interface 30 may be implemented on the basis of an inter-integrated circuit (I2C) method or a 3-wire or 4-wire serial peripheral interface (SPI) method.

The register circuit 32 is a circuit formed of a plurality of registers such as a status register, a command register, and a data register. An external device of the circuit device accesses each register of the register circuit 32 via the digital interface 30. The external device can check a status of the circuit device, and issue a command to the circuit device, by using the register of the register circuit 32. Alternatively, the external device can transmit data to the circuit device (processor 50), or read data from the circuit device (processor 50).

The processor 50 performs various signal processes on the basis of input data. For example, the processor 50 performs a signal process on frequency control data DFCI (frequency control code) which is input from an external device (for example, an external frequency control data generator) via the digital interface 30. As will be described later, in a case where a frequency control data generator is provided inside the circuit device, the processor 50 may perform a signal process on frequency control data DFCI (frequency control data based on a phase comparison result from an internal phase comparator) from the internal frequency control data generator.

Specifically, the processor 50 (digital signal processor) performs signal processes (digital signal processes) such as an aging correction process and a Karman filter process, and a temperature compensation process as necessary, on the frequency control data DFCI (external or internal frequency control data). Frequency control data DFCQ (frequency control code) having undergone the signal process is output to the oscillation signal generation circuit 140. The processor 50 may be implemented by an ASIC circuit such as a gate array, and may be implemented by a processor (a DSP or a CPU) and a program (program module) operating on the processor.

A resonator XTAL is, for example, an AT cut or SC cut quartz crystal resonator which is of a thickness shear vibration type, or a flexural vibration type piezoelectric resonator. The resonator XTAL is of a type of being provided in a thermostatic oven of an oven type oscillator (OCXO; Oven Controlled Crystal Oscillator), but is not limited thereto, and may be a resonator for a TCXO not provided with a thermostatic oven. The resonator XTAL may be a resonator (an electromechanical resonator or an electrical resonance circuit). As the resonator XTAL, a surface acoustic wave (SAW) resonator as a piezoelectric resonator, a microelectromechanical system (MEMS) resonator as a silicon resonator, and the like may be used. As a substrate metal of the resonator XTAL, a piezoelectric single crystal of quartz crystal, Lithium Tantalate, or Lithium Niobate, a piezoelectric material such as piezoelectric ceramics of lead zirconate titanate or the like, or a silicon semiconductor material may be used. The resonator XTAL may be excited due to a piezoelectric effect, and may be excited by using electrostatic driving based on a Coulomb force.

The oscillation signal generation circuit 140 generates an oscillation signal OSCK. For example, the oscillation signal generation circuit 140 generates the oscillation signal OSCK of an oscillation frequency set on the basis of the frequency control data DFCQ by using the frequency control data DFCQ (frequency control data having undergone a signal process) from the processor 50 and the resonator XTAL. As an example, the oscillation signal generation circuit 140 causes the resonator XTAL to oscillate at an oscillation frequency set by the frequency control data DFCQ and thus to generate the oscillation signal OSCK.

The oscillation signal generation circuit 140 may be a circuit which generates the oscillation signal OSCK according to a direct digital synthesizer method. For example, the oscillation signal OSCK having an oscillation frequency set on the basis of the frequency control data DFCQ may be digitally generated by using an oscillation signal from the resonator XTAL (an oscillation source with a fixed oscillation frequency) as a reference signal.

The oscillation signal generation circuit 140 may include a D/A converter 80 and an oscillation circuit 150. However, a configuration of the oscillation signal generation circuit 140 is not limited to such a configuration, and may be variously modified by omitting some constituent elements or adding other constituent elements thereto.

The D/A converter 80 performs D/A conversion on the frequency control data DFCQ (output data from the processor) from the processor 50. The frequency control data DFCQ which is input to the D/A converter 80 is frequency control data (frequency control code) having undergone signal processes (for example, an aging correction process, a temperature compensation process, or a Karman filter process) in the processor 50. As a D/A conversion type of the D/A converter 80, a resistance string type (resistance division type) may be employed. However, a D/A conversion type is not limited thereto, and various types such as a resistance ladder type (R-2R ladder type or the like), a capacitor array type, and a pulse width modulation type may be employed. The D/A converter 80 may include a control circuit, a modulation circuit (a dithering circuit or a PWM circuit), a filter circuit, or the like, in addition a D/A converter.

The oscillation circuit 150 generates the oscillation signal OSCK by using an output voltage VQ from the D/A converter 80, and the resonator XTAL. The oscillation circuit 150 is connected to the resonator XTAL via first and second resonator terminals (resonator pads). For example, the oscillation circuit 150 causes the resonator XTAL (a piezoelectric resonator, a resonator, or the like) to oscillate so as to generate the oscillation signal OSCK. Specifically, the oscillation circuit 150 causes the resonator XTAL to oscillate at an oscillation frequency at which the output voltage VQ of the D/A converter 80 is used as a frequency control voltage (oscillation control voltage). For example, in a case where the oscillation circuit 150 is a circuit (VCO) which controls oscillation of the resonator XTAL through voltage control, the oscillation circuit 150 may include a variable capacitance capacitor (varicap or the like) whose capacitance value varies depending on a frequency control voltage.

As described above, the oscillation circuit 150 may be implemented by a direct digital synthesizer type circuit, and, in this case, an oscillation frequency of the resonator XTAL is used as a reference frequency and is different from an oscillation frequency of the oscillation signal OSCK.

The clock signal generation circuit 160 generates a clock signal CK on the basis of the oscillation signal OSCK. For example, the clock signal generation circuit 160 includes at least a phase comparator 161 (comparison calculator), and generates the clock signal CK having a frequency obtained through multiplication of an oscillation frequency of the oscillation signal OSCK. The clock signal generation circuit 160 includes, for example, an output buffer circuit 168, and the clock signal CK which has been buffered in the output buffer circuit 168 is output. The clock signal generation circuit 160 is a PLL circuit having, for example, a PLL loop. The PLL circuit may be an analog type circuit, and may be a digital type circuit (ADPLL). In a case where the clock signal CK is generated through multiplication of an oscillation frequency of the oscillation signal OSCK, a multiplication number (multiplication ratio) may be 1 or greater, or may be smaller than 1. A multiplication number is not limited to an integer, and may be a decimal.

The circuit device includes the first terminal group TG1 for connection of the digital interface 30, the second terminal group TG2 for connection of the oscillation circuit 150 of the oscillation signal generation circuit 140, and the third terminal group TG3 for connection of the clock signal generation circuit 160 (PLL circuit). Here, the terminal group for connection indicates a terminal group for external connection, used to connect each circuit block to an external device. Each of the terminal groups (pad groups) TG1 to TG3 includes, for example, a plurality of terminals (pads). The terminals are external connection terminals and are used to input or output signals (digital signals or analog signals) to or from an external device.

For example, the first, second and third terminal groups TG1, TG2 and TG3 are terminal groups respectively connected to the digital interface 30, the oscillation circuit 150, and the clock signal generation circuit 160. The first, second and third terminal groups TG1, TG2 and TG3 may be respectively connected to the respective circuit blocks such as the digital interface 30, the oscillation circuit 150, and the clock signal generation circuit 160 via I/O cells. As the I/O cells, there are an input I/O cell having an input buffer, an output I/O cell having an output buffer, and an input/output I/O cell having an input buffer and an output buffer. For example, in a case where signals are input to the respective circuit blocks such as the digital interface 30, the oscillation circuit 150, and the clock signal generation circuit 160 from an external device, the signals may be input to the respective circuit blocks from the respective terminals of the first, second and third terminal groups TG1, TG2 and TG3 via input I/O cells (or input/output I/O cells). In a case where signals are output from the respective circuit blocks to an external device, the respective circuit blocks may output signals to the respective terminals of the first, second and third terminal groups TG1, TG2 and TG3 via output I/O cells (or input/output I/O cells). Such an I/O cell may or not be provided between each circuit block and each terminal.

The first terminal group TG1 for the digital interface 30 may include, for example, a serial clock line terminal (pad) and a serial data line terminal (pad) for serial interface of the digital interface 30. In a case where there are a serial data line for inputting a signal and a serial data line for outputting a signal, the first terminal group TG1 may include a serial data line terminal for inputting a signal and a serial data line terminal for outputting a signal. The first terminal group TG1 may include, for example, a terminal for a power supply voltage VSS (GND) or a chip select terminal in addition to the terminals.

The second terminal group TG2 for the oscillation circuit 150 may include, for example, first and second resonator terminals (resonator pads) connected to the resonator XTAL. For example, the first resonator terminal is connected to one end of the resonator XTAL, and the second resonator terminal is connected to the other end of the resonator XTAL. The second terminal group TG2 may include, for example, an output terminal of the oscillation signal OSCK, a connection terminal of a capacitor for stabilization, a connection terminal of a capacitor for adjusting an oscillation frequency, or a connection terminal of a filter.

The third terminal group TG3 for the clock signal generation circuit 160 may include an output terminal of the clock signal CK. For example, in a case where the clock signal generation circuit 160 outputs a plurality of clock signals CK1 to CKj (for example, CK1 to CK5 in FIG. 33) having different from frequencies (multiplication numbers), a plurality of output terminals for outputting the plurality of clock signals CK1 to CKj. The third terminal group TG3 may include an output terminal (PLL clock signal output terminal) of a clock signal before being buffered by the output buffer circuit 168, or an input terminal (PLL clock signal input terminal) of a clock signal before being buffered. As in FIG. 11 which will be described later, in a case where an external oscillator VCXO is used to generate the clock signal CK in the clock signal generation circuit 160, the third terminal group TG3 may include a terminal for outputting a frequency control voltage to the oscillator VCXO.

Figure 2:
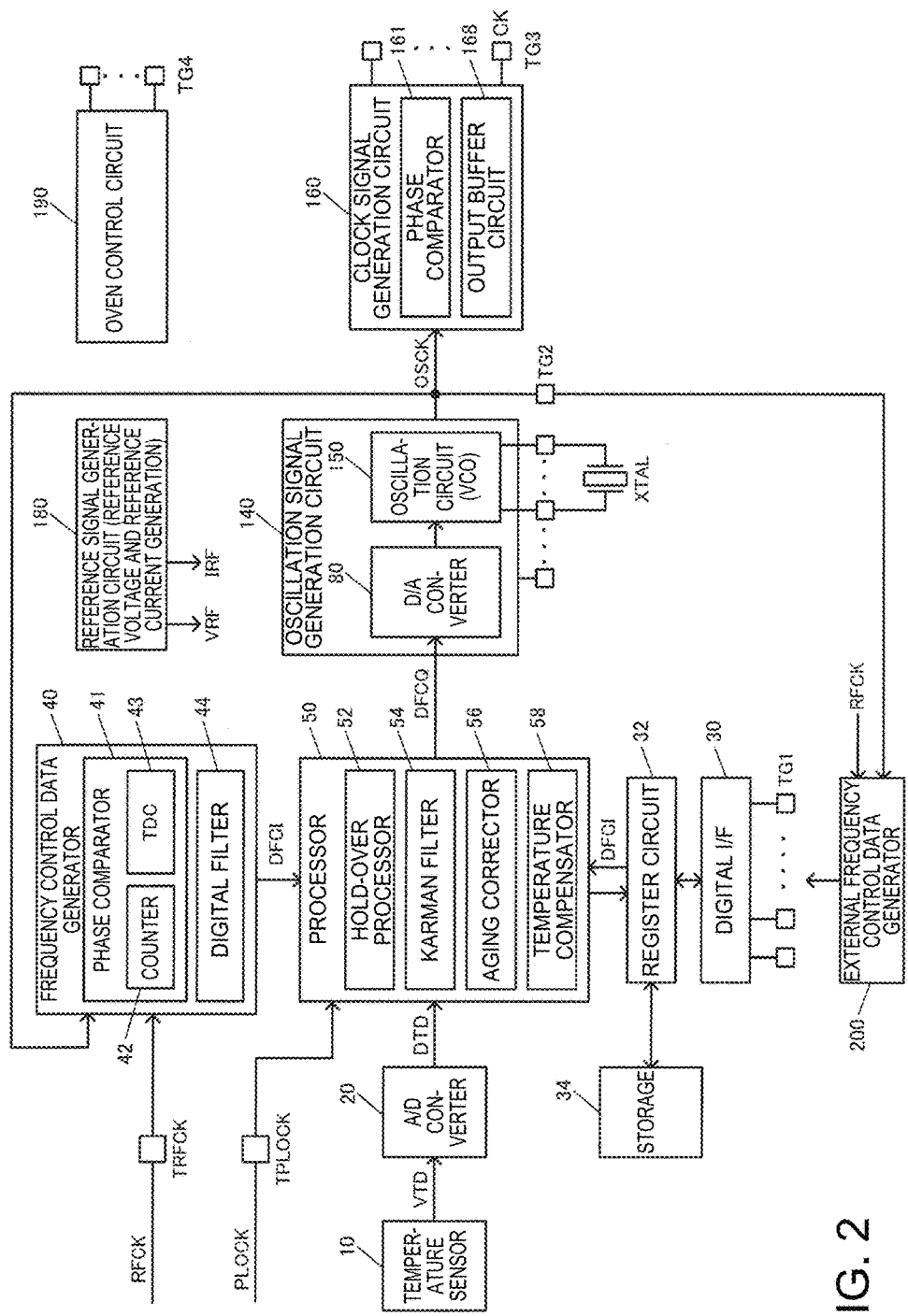
FIG. 2 is a diagram illustrating a detailed configuration example of the circuit device according to an embodiment of the invention.

FIG. 2 illustrates a detailed configuration example of the circuit device of the present embodiment. In FIG. 2, a temperature sensor 10, an A/D converter 20, a storage 34, a frequency control data generator 40 (in a broad sense, a phase comparator), a reference signal generation circuit 180, an oven control circuit 190, and a fourth terminal group TG4 are additionally provided in the configurations illustrated in FIG. 1. A configuration of the circuit device is not limited to the configuration illustrated in FIG. 2, and may be variously modified by omitting some constituent elements (for example, the frequency control data generator, the reference signal generation circuit, and the oven control circuit) or adding other constituent elements thereto. For example, as the temperature sensor 10, a temperature sensor provided outside the circuit device may be used.

The temperature sensor 10 outputs a temperature detection voltage VTD. Specifically, a temperature-dependent volume which changes depending on the temperature of the environment (circuit device) is output as the temperature detection voltage VTD. A specific configuration example of the temperature sensor 10 will be described later.

The A/D converter 20 performs A/D conversion on the temperature detection voltage VTD from the temperature sensor 10 so as to output temperature detection data DTD. For example, the digital temperature detection data DTD (A/D result data) corresponding to an A/D conversion result of the temperature detection voltage VTD is output. As an A/D conversion method in the A/D converter 20, for example, a successive comparison method or a method similar to the successive comparison method may be employed. An A/D conversion method is not limited to such methods, and various methods (a counting type, a parallel comparison type, and a series/parallel type) may be employed.

The storage 34 stores various pieces of information which is necessary in various processes or operations of the circuit device. The storage 34 may be implemented by, for example, a nonvolatile memory. As the nonvolatile memory, for example, an EEPROM may be used. For example, a metal-oxide-nitride-oxide-silicon (MONOS) type memory may be used as the EEPROM. For example, a flash memory using the MONOS type memory may be used. Alternatively, memories of other types such as a floating gate type may be used as the EEPROM. The storage 34 may be implemented by, for example, a fuse circuit as long as information can be held and stored even in a state in which power is not supplied.

The storage 34 stores a system noise constant (V) for setting system noise in a Karman filter process and an observation noise constant (W) for setting observation noise in the Karman filter process. For example, measurement (inspection) is performed in order to monitor various pieces of information such as an oscillation frequency during manufacturing and shipment of products (oscillator and the like). A system noise constant or an observation noise constant is determined on the basis of the measurement results, and is written to the storage 34 implemented by, for example, a nonvolatile memory. In the above-described way, it is possible to set a system noise constant or an observation noise constant on which an element variation has a reduced adverse effect.

The processor 50 includes a hold-over processor 52 (a hold-over processing circuit or program module), a Karman filter 54 (a Karman filter processing circuit or program module), an aging corrector 56 (an aging correction processing circuit or program module), and a temperature compensator 58 (a temperature compensation processing circuit or a program module). The hold-over processor 52 performs various processes regarding hold-over. The Karman filter 54 performs a process of obtaining, for example, a true value of frequency control data (oscillation frequency) through a Karman filter process. The aging corrector 56 performs aging correction for compensating for a secular change of an oscillation frequency. The temperature compensator 58 performs a temperature compensation process on an oscillation frequency on the basis of the temperature detection data DTD from the A/D converter 20. Specifically, the temperature compensator 58 performs a temperature compensation process for reducing an oscillation frequency change in a case where a temperature change occurs on the basis of the temperature detection data DTD (temperature-dependent data) which changes depending on a temperature, and coefficient data (coefficient data of an approximate function) for the temperature compensation process.

A reference signal RFCK is input to the circuit device via a terminal TRFCK (pad) which is an external condition terminal of the circuit device. A signal PLOCKE for performing a notification of whether or not an external PLL circuit is in a lock state is input to the circuit device via the terminal TPLOCKE (pad) which is an external connection terminal of the circuit device. The external PLL circuit is a PLL circuit formed of an external frequency control data generator 200 provided outside the circuit device and the oscillation signal generation circuit 140 provided inside the circuit device.

The frequency control data generator 40 generates the frequency control data DFCI. For example, the frequency control data DFCI is generated by comparing an input signal based on the oscillation signal OSCK with the reference signal RFCK. The generated frequency control data DFCI is input to the processor 50. Here, the input signal based on the oscillation signal OSCK may be the oscillation signal OSCK, and may be a signal (for example, a signal obtained through division) generated from the oscillation signal OSCK. Hereinafter, a case where an input signal is the oscillation signal OSCK will be mainly described as an example.

The frequency control data generator 40 includes a phase comparator 41 and a digital filter 44. The phase comparator 41 (phase calculator) is a circuit performing phase comparison (comparison calculation) between the oscillation signal OSCK and the reference signal RFCK which are input signals, and includes a counter 42 and a time digital converter (TDC) 43.

The counter 42 generates digital data corresponding to an integer part of a result obtained by dividing a reference frequency (for example, 1 Hz) of the reference signal RFCK by an oscillation frequency of the oscillation signal OSCK. The TDC 43 generates digital data corresponding to a decimal part of the division result. The TDC 43 includes, for example, a plurality of delay elements; a plurality of latch circuits which latch a plurality of delayed clock signals output from the plurality of delay elements at edge (high) timings of the reference signal RFCK; and a circuit which generates digital data corresponding to a decimal part of a division result by coding output signals from the plurality of latch circuits. The phase comparator 41 adds the digital data corresponding to the integer part from the counter 42 to the digital data corresponding to the decimal part from the TDC 43, so as to detect a phase error with respect to a set frequency. The digital filter 44 performs a smoothing process on the phase error so as to generate the frequency control data DFCI. For example, in a case where a frequency of the oscillation signal OSCK is indicated by FOS, a frequency of the reference signal RFCK is indicated by FRF, and a division number (division ratio) corresponding to a set frequency is indicated by FCW, the frequency control data DFCI is generated so as to satisfy a relationship of FOS=FCW×FRF. Alternatively, the counter 42 may count the number of clocks of the oscillation signal OSCK. In other words, the counter 42 performs a counting operation with an input signal based on the oscillation signal OSCK. The phase comparator 41 may compare a counted value in the counter 42 in n cycles (where n is an integer of 2 or greater) of the reference signal RFCK with an expected value (n×FCW) corresponding to the counted value in integers. For example, a difference between an expected value and a counted value in the counter 42 is output from the phase comparator 41 as phase error data.

A configuration of the frequency control data generator 40 is not limited to the configuration illustrated in FIG. 2, and may be variously modified. For example, the phase comparator 41 may be formed of a phase comparator of an analog circuit, or the digital filter 44 may be formed of a filter (loop filter) of an analog circuit and an A/D converter. The process (the smoothing process on phase error data) in the digital filter 44 may be performed by the processor 50. For example, the processor 50 performs the process in the digital filter 44 along with other processes (a hold-over process, a Karman filter process, and the like) in a time division manner. For example, the processor 50 performs a filter process (smoothing process) on a phase comparison result (phase error data) in the phase comparator 41.

In the present embodiment, a loop of a PLL circuit may also be formed of the external frequency control data generator 200 provided outside the circuit device and the oscillation signal generation circuit 140. In this case, the frequency control data DFCI from the external frequency control data generator 200 is input to the processor 50 via the digital interface 30. The processor 50 performs signal processes such as a temperature compensation process and aging correction on the frequency control data DFCI from the external frequency control data generator 200, and frequency control data DFCQ having undergone the signal processes is input to the oscillation signal generation circuit 140. The oscillation signal generation circuit 140 generates the oscillation signal OSCK by using the frequency control data DFCQ. The generated oscillation signal OSCK is output to the external frequency control data generator 200 via the output terminal of the second terminal group TG2. The external frequency control data generator 200 performs phase comparison (comparison calculation) between the oscillation signal OSCK and the reference signal RFCK so as to generate the frequency control data DFCI. The external frequency control data generator 200 may be implemented by the same configuration as that of the internal frequency control data generator 40 of the circuit device, and may include, for example, a phase comparator provided with a counter and a TDC, and a digital filter.

The reference signal generation circuit 180 generates a reference signal such as a reference voltage VRF or a reference current IRF. The reference signal generation circuit 180 may include, for example, a circuit generating a constant voltage such as a bandgap reference voltage, a circuit generating the reference voltage VRF on the basis of a generated constant voltage, or a circuit generating the reference current IRF on the basis of a generated constant voltage. The generated reference voltage VRF or reference current IRF is supplied to an analog circuit (for example, the A/D converter 20, the D/A converter 80, or the oven control circuit 190) of the circuit device. The analog circuit performs an analog circuit process by using the reference voltage VRF or the reference current IRF.

The oven control circuit 190 performs oven control of the oven type resonator XTAL in a case where the resonator XTAL is an oven type resonator (a double-oven type, a single-oven type, or the like) having a thermostatic oven. For example, the oven control circuit 190 controls heat generation of a heater (heat generation element) for adjusting an oven temperature. Specifically, heat generation of the heater is controlled by using a temperature sensor for oven control which is provided to correspond to the heater. Temperature adjustment is performed so that the oven temperature becomes a set temperature.

The fourth terminal group TG4 is a terminal group (pad group) for connection (external connection) of the oven control circuit 190. The fourth terminal group TG4 includes an oven control terminal of the oven type resonator XTAL. For example, the fourth terminal group TG4 may include an output terminal of a heater control voltage as the oven control terminal. For example, in a case of a double-oven structure which will be described later, the fourth terminal group TG4 may include two output terminals of heater control voltages so as to correspond to control of the respective ovens. The fourth terminal group TG4 may include, for example, a connection terminal (in a case of a double-oven structure, two connection terminals corresponding to two temperature sensors) of a temperature sensor for oven control, a connection terminal of a capacitor for oven control stabilization, or an input terminal of a reference voltage for oven control.

2. Phase Noise

As mentioned above, in the circuit device of the present embodiment, the digital interface 30 is provided, and the processor 50 can perform various signal processes on the basis of data which is input from an external device via the digital interface 30. As an example, as described above, the frequency control data DFCI is input to the processor 50 from the external frequency control data generator 200 which is an external device, via the digital interface 30. The oscillation signal generation circuit 140 generates the oscillation signal OSCK on the basis of the frequency control data DFCQ having undergone signal processes, and the oscillation signal OSCK is fed back to the external frequency control data generator 200 via the output terminal of the second terminal group TG2, so that a PLL loop of the external PLL circuit is formed.

In the present embodiment, there is provided the clock signal generation circuit 160 which generates the clock signal CK having a frequency obtained through multiplication of an oscillation frequency of the oscillation signal OSCK. In the above-described way, the clock signal CK having any frequency can be generated by using the oscillation signal OSCK having a constant oscillation frequency by the clock signal generation circuit 160, and can be supplied to each circuit of an electronic apparatus into which the circuit device is incorporated. For example, in a case of a base station illustrated in FIG. 33 as an example of an electronic apparatus, clock signals CK1 to CK5 can be generated by the clock signal generation circuit 160 so as to be supplied to each circuit forming the base station.

In this case, a PLL circuit (hereinafter, referred to as a first-stage PLL circuit) formed of the frequency control data generator 40 (phase comparator 41) or the external frequency control data generator 200 and the oscillation signal generation circuit 140 is phase-synchronized with the reference signal RFCK having a low frequency (for example, 1 Hz) and generates the oscillation signal OSCK. Thus, the oscillation signal OSCK generated by the first-stage PLL circuit locked with the reference signal RFCK having a low frequency has little phase noise in a low frequency bandwidth but has much phase noise in a high frequency bandwidth. For example, various noise components are superposed on the reference signal RFCK from a GPS or the like, but phase noise of the oscillation signal OSCK in a high frequency bandwidth increases due to the influence of the noise or the like.

On the other hand, a second-stage PLL circuit formed of the clock signal generation circuit 160 is phase-synchronized with the oscillation signal OSCK having a frequency higher than that of the reference signal RFCK, and generates the clock signal CK, and thus phase noise in a high frequency bandwidth can be reduced. Therefore, according to the circuit device of the present embodiment in which the oscillation signal OSCK is generated by the first-stage PLL circuit, and the clock signal CK is generated by using the oscillation signal OSCK by the second-stage PLL circuit (clock signal generation circuit 160), phase noise in a low frequency bandwidth can be reduced by the first-stage PLL circuit, and phase noise in a high frequency bandwidth can be reduced by the second-stage PLL circuit. Therefore, there is an advantage in that the clean clock signal CK with less phase noise in a wide frequency bandwidth from a low frequency bandwidth to a high frequency bandwidth can be generated. For example, in the base station illustrated in FIG. 33 which will be described later, it is necessary to reduce phase noise of the clock signal CK5 supplied to an RF circuit 608 in order to improve reception performance of the RF circuit 608. According to the circuit device of the present embodiment, the clock signal CK5 (=CK) with little phase noise in a wide frequency bandwidth from a low frequency bandwidth to a high frequency bandwidth can be generated to be supplied to the RF circuit 608, and thus it is possible to improve reception performance.

As mentioned above, in the circuit device of the present embodiment, there is an advantage in that phase noise is doubly reduced by using the second-stage PLL circuit, and thus the clean clock signal CK with reduced noise can be generated.

However, in the present embodiment, since the digital interface 30 is provided, it has been proved that there is a problem in that phase noise of the clock signal CK increases due to communication noise generated by the digital interface 30. For example, communication noise in the terminal group TG1 of the digital interface 30 is forwarded to the terminal group TG3 of the clock signal generation circuit 160, and thus phase noise of the clock signal CK increases.

Figure 3:
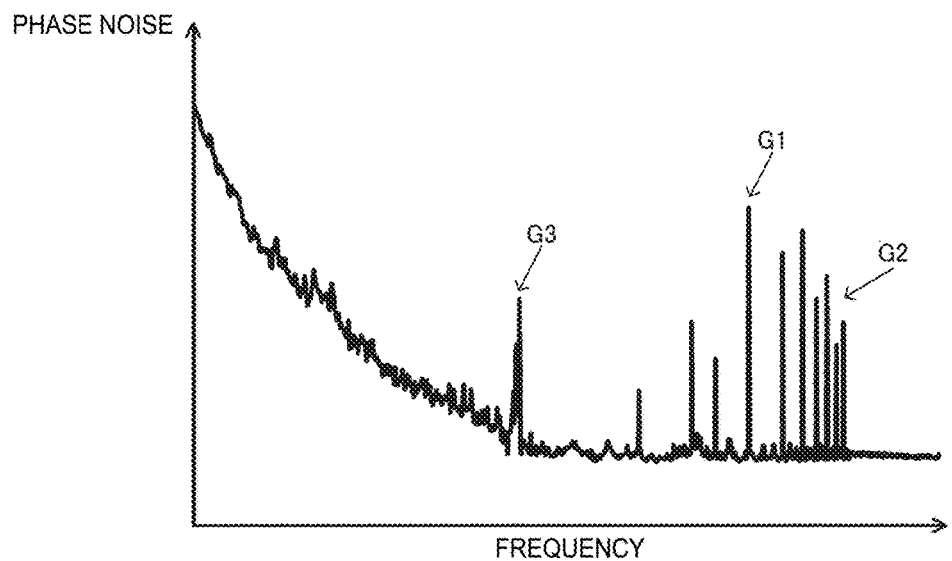
FIG. 3 is a diagram for explaining a problem of phase noise of an oscillation signal.
Figure 33:
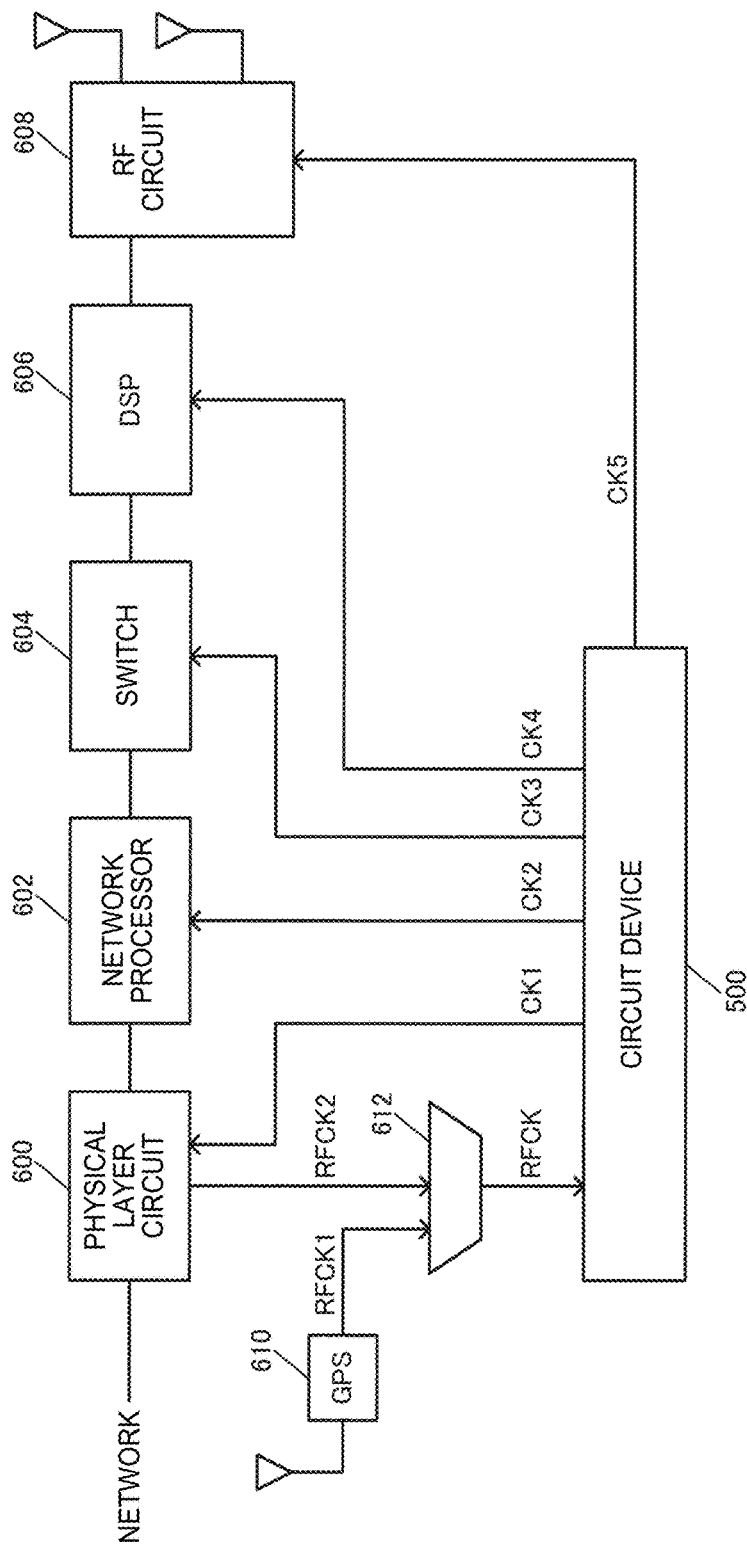
FIG. 33 is a diagram illustrating a configuration example of a base station which is one of the electronic apparatuses.

For example, FIG. 3 is a diagram illustrating an example of phase noise of the clock signal CK. A transverse axis expresses a frequency, and a longitudinal axis expresses phase noise. G1 in FIG. 3 indicates phase noise corresponding to a frequency of a communication clock of the digital interface 30. For example, the digital interface 30 performs communication by using the serial clock line and the serial data line, but phase noise of a communication clock frequency (for example, 100 KHz) of the serial clock line is generated in the clock signal CK. Phase noise with a high level is also generated in a frequency bandwidth indicated by G2 higher than the frequency at G1 and a frequency bandwidth indicated by G3 lower than the frequency at G1. As mentioned above, if the phase noise with a high level as indicated by G1, G2, and G3 is superposed on the clock signal CK, for example, there is the occurrence of a problem that reception performance of the RF circuit 608 in FIG. 33 is reduced.

If noise generated in the terminal group TG2 of the oscillation circuit 150 is forwarded to the terminal group TG3 of the clock signal generation circuit 160, or, conversely, noise generated in the terminal group TG3 is forwarded to the terminal group TG2, phase noise further increases.

3. Layout Arrangement

Figure 5:
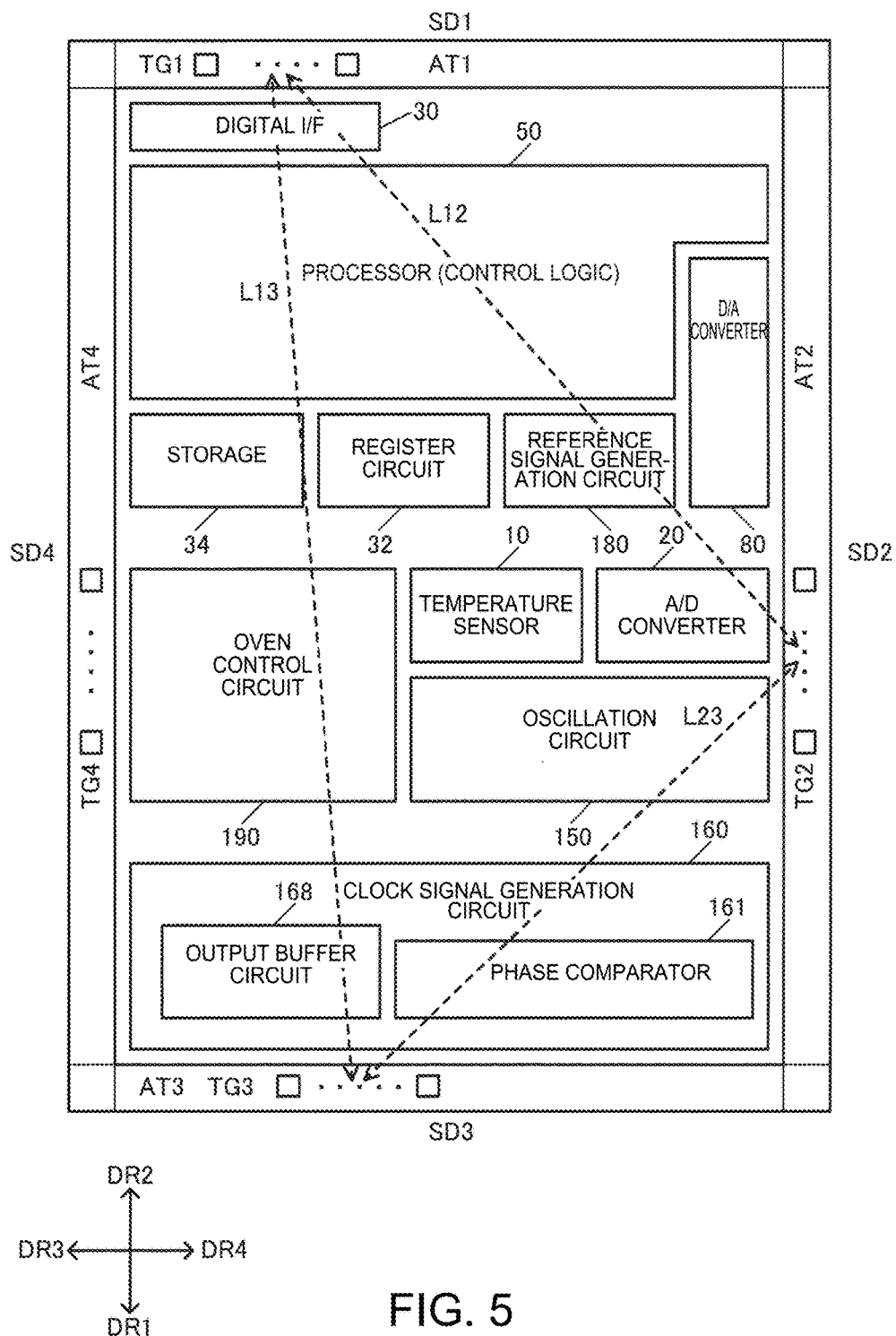
FIG. 5 is a diagram illustrating a layout arrangement configuration example of the circuit device according to an embodiment of the invention.

In the present embodiment, in order to solve the above-described problem, a layout technique described below is employed. For example, FIG. 5 illustrates an example of a layout arrangement of the circuit device of the present embodiment. A layout arrangement of the cdiv of the present embodiment is not limited to the arrangement in FIG. 5, and may be variously modified (for example, FIGS. 6 to 10 which will be described later).

As illustrated in FIGS. 1, 2 and 5, the circuit device of the present embodiment includes the digital interface 30, the processor 50, the oscillation signal generation circuit 140 (oscillation circuit 150), the clock signal generation circuit 160 (PLL circuit), and the first, second and third terminal groups TG1, TG2 and TG3. Here, the processor 50 receives data (for example, the frequency control data DFCI) from an external device (for example, the external frequency control data generator 200) via the digital interface 30, and performs a signal process. For example, signal processes such as a temperature compensation process and aging correction are performed. The oscillation signal generation circuit 140 generates the oscillation signal OSCK having an oscillation frequency set by the frequency control data DFCQ by using the frequency control data DFCQ from the processor 50 and the resonator XTAL. The clock signal generation circuit 160 includes at least the phase comparator 161, and generates the clock signal CK having a frequency obtained through multiplication of an oscillation frequency of the oscillation signal OSCK.

Here, as illustrated in FIG. 5, a side intersecting (orthogonal to) a first side SD1 of the circuit device is set to a second side SD2, and a side opposing the first side SD1 is set to a third side SD3. A side opposing the second side SD2 is set to a fourth side SD4.

In this case, the first terminal group TG1 for connection of the digital interface 30 is disposed in a first terminal region AT1 along the first side SD1 of the circuit device. On the other hand, the third terminal group TG3 for connection of the clock signal generation circuit 160 is disposed in any one of a second terminal region AT2 along the second side SD2, a third terminal region AT3 along the third side SD3, and a fourth terminal region AT4 along the fourth side SD4. Specifically, in FIG. 5, the second terminal group TG2 for connection of the oscillation circuit 150 is disposed in the second terminal region AT2 along the second side SD2, and the third terminal group TG3 for connection of the clock signal generation circuit 160 is disposed in the third terminal region AT3 along the third side SD3.

As a technique of disposing the terminal groups in the present embodiment, various modifications may occur as described with reference to FIGS. 6 to 10 which will be described later. For example, the second terminal group TG2 may be disposed in the third terminal region AT3, and the third terminal group TG3 may be disposed in the second terminal region AT2. In other words, the second terminal group TG2 may be disposed in one of the second terminal region AT2 and the third terminal region AT3, and the third terminal group TG3 may be disposed in the other of the regions AT2 and AT3. The fourth terminal group TG4 is disposed in the fourth terminal region AT4 along the fourth side SD4.

Here, the first to fourth sides SD1 to SD4 correspond to edge sides of an IC of the circuit device. The first to fourth terminal regions AT1 to AT4 are regions having predetermined widths, provided inside the first to fourth sides SD1 to SD4. Long side directions of the first to fourth terminal regions AT1 to AT4 are directions along the first to fourth sides SD1 to SD4, and the predetermined widths are widths in short side directions of the first to fourth terminal regions AT1 to AT4.

The first to fourth terminal regions AT1 to AT4 are regions called I/O regions (peripheral regions), and I/O cells may be disposed therein in addition to the terminal groups TG1 to TG4. As the I/O cells, there are an input I/O cell to which a signal is input from an external device via each terminal, an output I/O cell which outputs a signal to an external device via each terminal, and an input/output I/O cell which is used for both of input and output of signals. Each terminal of the terminal groups TG1 to TG4 and each circuit block such as the digital interface 30, the oscillation circuit 150, and the clock signal generation circuit 160 may be connected to each other via the I/O cell, and may be connected to each other without using the I/O cell.

In the present embodiment, as illustrated in FIG. 5, the terminal group TG1 for the digital interface 30 is disposed in the terminal region AT1 along the side SD1, and the terminal group TG2 for the oscillation circuit 150 is disposed in the terminal region AT2 along the side SD2 intersecting the side SD1. Therefore, a distance L12 between the terminal groups TG1 and TG2 can be lengthened, and thus it is possible to effectively prevent communication noise generated in the digital interface 30 from being forwarded to the terminal group TG2. As a result, it is possible to reduce phase noise superposed on the oscillation signal OSCK due to the communication noise. If the phase noise of the oscillation signal OSCK is reduced, phase noise of the clock signal CK is also reduced.

In the present embodiment, the terminal group TG1 for the digital interface 30 is disposed in the terminal region AT1 along the side SD1, and the terminal group TG3 for the clock signal generation circuit 160 is disposed in the terminal region AT3 along the side SD3 opposing the side SD1. Therefore, a distance L13 between the terminal groups TG1 and TG3 can be lengthened, and thus it is possible to effectively prevent communication noise generated in the digital interface 30 from being forwarded to the terminal group TG3. As a result, it is possible to reduce phase noise superposed on the clock signal CK due to the communication noise.

In the present embodiment, the terminal group TG2 is disposed in the terminal region AT2 along the side SD2, and the terminal group TG3 is disposed in the terminal region AT3 along the side SD3 intersecting the side SD2. Therefore, a distance L23 between the terminal groups TG2 and TG3 can also be lengthened. Therefore, it is possible to prevent noise generated in the terminal group TG2 due to the oscillation signal OSCK or the like from being forwarded to the terminal group TG3, and also to prevent noise generated in the terminal group TG3 due to the clock signal CK or the like from being forwarded to the terminal group TG2.

For example, as described above, there is a difference between lock frequencies of the first-stage PLL circuit (the frequency control data generators 40 and 200, and the oscillation signal generation circuit 140) and the second-stage PLL circuit (clock signal generation circuit 160). If the two PLL circuits having different lock frequencies are present as mentioned above, signal noise of the PLL circuits is forwarded to each other, and thus superposed phase noise increases.

In relation to this fact, in FIG. 5, the terminal groups TG1, TG2 and TG3 are disposed in different terminal regions AT1, AT2 and AT3. In other words, the terminal groups TG1, TG2 and TG3 are disposed in different terminal regions AT1, AT2 and AT3 provided to respectively correspond to the different three sides SD1, SD2 and SD3. Thus, it is possible to increase not only the distance L12 between the terminal groups TG1 and TG2 and the distance L13 between the terminal groups TG1 and TG3 but also the distance L23 between the terminal groups TG2 and TG3. Therefore, it is possible to reduce not only phase noise caused by communication noise of the digital interface 30 but also phase noise caused by forwarding of signal noise between two PLL circuits. Therefore, it is possible to provide a circuit device which can generate the clock signal CK or the oscillation signal OSCK in which noise is sufficiently reduced compared with the related art.

Figure 4:
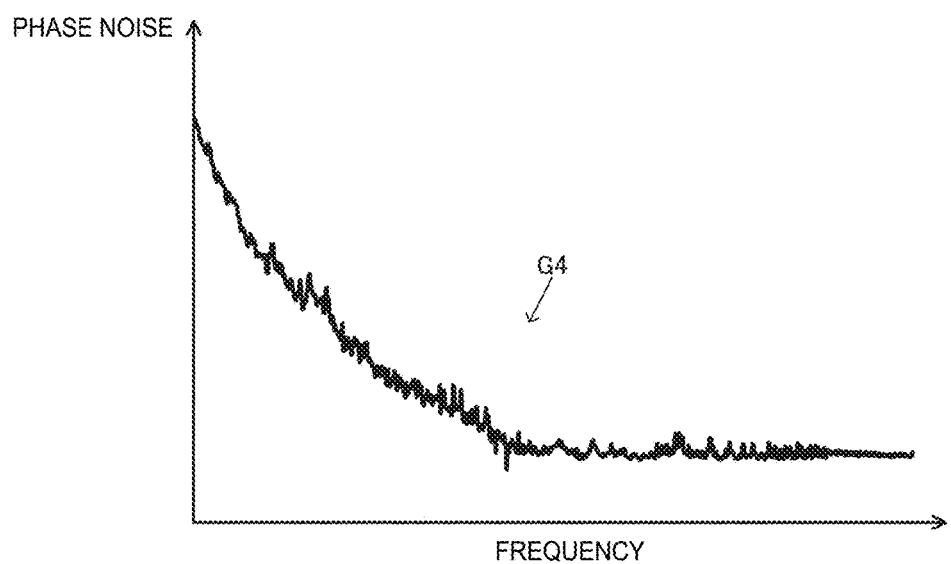
FIG. 4 is a diagram for explaining a problem of phase noise of an oscillation signal.

For example, FIG. 4 illustrates an example of phase noise of the clock signal CK in a case where the technique of the present embodiment is applied. As is clear when compared between G1, G2, and G3 in FIG. 3 and G4 in FIG. 4, according to the present embodiment, it is possible to reduce phase noise of the clock signal CK in a wide frequency bandwidth in a low frequency bandwidth to a high frequency bandwidth. Therefore, it is possible to supply the clean clock signal CK with reduced noise to each circuit (for example, the RF circuit 608 in FIG. 33) of an electronic apparatus into which the circuit device is incorporated.

In FIG. 5, the side SD1 is a short side of the circuit device, and the terminal group TG1 is disposed in the terminal region AT1 along the side SD1 which is a short side. In other words, in FIG. 5, the sides SD1 and SD3 are short sides of the circuit device, and the sides SD2 and SD4 are long sides of the circuit device, but the terminal group TG1 for connection of the digital interface 30 is disposed in the terminal region AT1 along the side SD1 which is a short side. In the above-described way, the terminal group TG1 and other terminal groups are be separated from each other by the distance corresponding to the sides SD2 and SD4 which are long sides. For example, the terminal group TG1 for connection of the digital interface 30 and the terminal group TG3 for connection of the clock signal generation circuit 160 can be disposed to be separated from each other by the distance L13 corresponding to the sides SD2 and SD4 which are long sides. Consequently, it is possible to effectively prevent communication noise generated in the digital interface 30 from being forwarded to the terminal group TG3.

In FIG. 5, in a case where a distance between the terminal groups TG1 and TG2 is indicated by L12, a distance between the terminal groups TG1 and TG3 is indicated by L13, and a distance between the terminal groups TG2 and TG3 is indicated by L23, at least one of the distances L12 and L13 is longer than the distance L23. Specifically, in FIG. 5, L13>L23, that is, the distance L13 between the terminal group TG1 and the terminal group TG3 is longer, and thus it is possible to effectively prevent communication noise generated in the digital interface 30 from being forwarded to the terminal group TG3. Specifically, in FIG. 5, L12>L23, that is, the distance L12 between the terminal group TG1 and the terminal group TG2 is longer, and thus it is possible to effectively prevent communication noise generated in the digital interface 30 from being forwarded to the terminal group TG2. As a result, it is possible to sufficiently lower phase noise superposed on the clock signal CK or the oscillation signal OSCK due to communication noise generated in the digital interface 30. A distance between a terminal group and a terminal group may be a distance (a distance between representative terminals) between terminals located at the centers among a plurality of terminals included in the respective terminal groups. In FIG. 5, both of the distances L13 and L12 are longer than the distance L23, but only one of the distances L13 and L12 may be longer than the distance L23.

In the present embodiment, as described with reference to FIG. 2, the frequency control data DFCI from the external frequency control data generator 200 which compares an input signal (for example, the oscillation signal OSCK itself) based on the oscillation signal OSCK with the reference signal RFCK is input to the processor 50 via the terminal group TG1 and the digital interface 30. The oscillation signal generation circuit 140 generates the oscillation signal OSCK on the basis of the frequency control data DFCQ from the external frequency control data generator 200 which is input via the processor 50.

In the above-described way, a PLL circuit can be formed by effectively using the external frequency control data generator 200 along with the internal oscillation signal generation circuit 140, so as to generate the oscillation signal OSCK. For example, in a case where an external system of the circuit device is implemented by a microcomputer, a controller, or a DSP, as the external frequency control data generator 200, a PLL circuit can be formed by effectively using the hardware resource so as to generate the oscillation signal OSCK.

In a case where the external frequency control data generator 200 is used as mentioned above, the frequency control data DFCI from the external frequency control data generator 200 is input to the processor 50 via the digital interface 30. Thus, communication noise is caused due to input of the frequency control data DFCI, and thus there is concern that phase noise with a high level may occur as indicated by G1, G2, G3 in FIG. 3.

In relation to this fact, as illustrated in FIG. 5, in the present embodiment, the terminal groups TG1, TG2 and TG3 are disposed in different terminal regions AT1, AT2 and AT3 so that the distance L12 between the terminal groups TG1 and TG2 and the distance L13 between the terminal groups TG1 and TG3 are lengthened. Therefore, even in a case where a PLL circuit is formed by effectively using the external frequency control data generator 200, it is also possible to effectively prevent an increase in phase noise caused by communication noise of the frequency control data DFCI.

The circuit device of the present embodiment includes, as illustrated in FIG. 2, the phase comparator 41 (frequency control data generator 40) which compares a phase of an input signal based on the oscillation signal OSCK with a phase of the reference signal RFCK. The phase comparator 41 or the frequency control data generator 40 including the phase comparator 41 may be formed in, for example, a control logic region in which the processor 50 illustrated in FIG. 5 is disposed. For example, the phase comparator 41 or the frequency control data generator 40 may be implemented by a control logic circuit which is formed by using automatically disposed wirings, such as a gate array.

In a first mode, the oscillation signal generation circuit 140 generates an oscillation signal on the basis of the frequency control data DFCQ which is input from the external frequency control data generator 200 via the processor 50. In other words, the processor 50 performs signal processes such as a frequency control data DFCI and aging correction on the frequency control data DFCI which is input from the external frequency control data generator 200, the frequency control data DFCQ having undergone the signal processes is input to the oscillation signal generation circuit 140, and thus the oscillation signal OSCK is generated.

On the other hand, in a second mode, the oscillation signal generation circuit 140 generates the oscillation signal OSCK on the basis of the frequency control data DFCQ which is input from the phase comparator 41 (frequency control data generator 40) via the processor 50. In other words, in the second mode, the processor 50 performs signal processes such as a frequency control data DFCI and aging correction on the frequency control data DFCI based on a phase comparison result from the phase comparator 41 of the circuit device, the frequency control data DFCQ having undergone the signal processes is input to the oscillation signal generation circuit 140, and thus the oscillation signal OSCK is generated. The frequency control data DFCI which has undergone a filter process in the digital filter 44 may be input from the frequency control data generator 40 to the processor 50. Alternatively, the processor 50 to which a phase comparison result from the phase comparator 41 is input may perform a filter process on the phase comparison result.

In the above-described way, in a case where an external system includes the external frequency control data generator 200, an operation mode of the circuit device is set to the first mode, and a PLL circuit can be formed by effectively using the external frequency control data generator 200 of the external system, thereby being capable of generating the oscillation signal OSCK.

On the other hand, in a case where the external system does not include the external frequency control data generator 200, an operation mode of the circuit device is set to the second mode, and a PLL circuit can be formed by using the phase comparator 41 (frequency control data generator 40) provided inside the circuit device, thereby being capable of generating the oscillation signal OSCK.

Therefore, it is possible to cope with both of the cases where an external system includes and does not include the external frequency control data generator 200, and thus to improve convenience.

In the present embodiment, as the digital interface 30, a 2-wire, 3-wire, or 4-wire serial interface circuit including a serial data line and a serial clock line may be employed. In the above-described way, a serial interface circuit such as I2C or SPI may be used as the digital interface 30. Therefore, in a case where an external device such as a microcomputer or a controller includes a serial interface circuit such as I2C or SPI, a serial interface process based on I2C or SPI can be performed with the external device, and thus data (frequency control data) from an external device (external frequency control data generator 200) can be input to the processor 50.

In FIG. 5, a direction directed from the first side SD1 toward the third side SD3 is set to a first direction DR1, and an opposite direction to the first direction DR1 is set to a second direction DR2. A direction intersecting (orthogonal to) the first direction DR1 is set to a third direction DR3, and an opposite direction to the third direction DR3 is set to a fourth direction DR4. In this case, in the circuit device of the present embodiment, as illustrated in FIG. 5, the processor 50 is disposed on the first direction DR1 of the first terminal group TG1 (first terminal region AT1). For example, the digital interface 30 is disposed on the first direction DR1 side of the first terminal group TG1 (first terminal region AT1), and the processor 50 is disposed on the first direction DR1 of the digital interface 30.

In the above-described way, data such as frequency control data which is input from an external device by using the terminals of the first terminal group TG1 can be input to the processor 50 along a short signal path via the digital interface 30. Consequently, a location as a generation source of communication noise of data such as frequency control data can be restricted to the vicinity of the location of the first terminal group TG1 or the location on the second direction DR2 side of the processor 50. Therefore, a distance (L12 or L13) between the generation source of communication noise and the second terminal group TG2 or the third terminal group TG3 can be lengthened, and thus it is possible to reduce phase noise caused by the communication noise.

In FIG. 5, the second terminal group TG2 is disposed in the second terminal region AT2, the third terminal group TG3 is disposed in the third terminal region AT3, and the clock signal generation circuit 160 is disposed on the second direction DR2 side of the third terminal group TG3 (third terminal region AT3). For example, the third terminal group TG3 and the clock signal generation circuit 160 are disposed to be adjacent to each other without other circuit blocks (circuit elements) interposed therebetween.

In the above-described way, an output signal (for example, the clock signal CK or a frequency control voltage signal) from the clock signal generation circuit 160 can be output along a short signal path from the clock signal generation circuit 160 to the terminals of the third terminal group TG3. An input signal to the terminals of the third terminal group can be input along a short signal path from the terminals of the third terminal group TG3 to the clock signal generation circuit 160. Consequently, a location as a generation source of clock noise due to a signal (for example, the clock signal CK) from the clock signal generation circuit 160 can be restricted to the vicinity of the location of the third terminal group TG3 or the location on the first direction DR1 side of the clock signal generation circuit 160. Therefore, a distance (L23) between a generation source of the clock noise and the second terminal group TG2 can be lengthened, and thus it is possible to reduce phase noise caused by the clock noise.

In FIG. 5, the processor 50 is disposed between the first terminal region AT1 and the clock signal generation circuit 160. For example, the processor 50 is disposed on the first direction DR1 side of the first terminal region AT1, and the clock signal generation circuit 160 is disposed on the first direction DR1 side of the processor 50. The third terminal region AT3 is disposed on the first direction DR1 side of the clock signal generation circuit 160.

In the above-described way, the processor 50 and the clock signal generation circuit 160 are interposed between the first terminal group TG1 in the first terminal region AT1 and the third terminal group TG3 in the third terminal region AT3. Therefore, as the distance L13 between the first terminal group TG1 and the third terminal group TG3, at least a distance corresponding to a width of the processor 50 and a width of the clock signal generation circuit 160 can be secured. In other words, as the distance L13, at least a distance corresponding to the widths of the processor 50 and the clock signal generation circuit 160 in the first direction DR1 can be secured. Therefore, the distance L13 between the first terminal group TG1 and the third terminal group TG3 can be lengthened, and thus it is possible to reduce phase noise caused by communication noise in the digital interface 30.

In FIG. 5, the oscillation circuit 150 is disposed between the processor 50 and the clock signal generation circuit 160. For example, the oscillation circuit 150 is disposed on the first direction DR1 side of the processor 50, and the clock signal generation circuit 160 is disposed on the first direction DR1 side of the oscillation circuit 150. For example, the reference signal generation circuit 180 which generates a reference voltage and a reference current is disposed between the processor 50 and the oscillation circuit 150. The temperature sensor 10 and the A/D converter 20 are disposed between the processor 50 and the oscillation circuit 150.

In the above-described way, the processor 50, the oscillation circuit 150, and the clock signal generation circuit 160 are interposed between the first terminal group TG1 in the first terminal region AT1 and the third terminal group TG3 in the third terminal region AT3. Therefore, as the distance L13 between the first terminal group TG1 and the third terminal group TG3, at least a distance corresponding to the width of the processor 50, a width of the oscillation circuit 150, and the width of the clock signal generation circuit 160 can be secured. Therefore, the distance L13 between the first terminal group TG1 and the third terminal group TG3 can be further lengthened, and thus it is possible to further lower phase noise caused by communication noise in the digital interface 30.

In FIG. 5, the oscillation circuit 150 is disposed on the third direction DR3 side of the second terminal group TG2. For example, the oscillation circuit 150 and the second terminal group TG2 are disposed to be adjacent to each other without other circuit blocks (circuit elements) interposed therebetween.

In the above-described way, the oscillation circuit 150 and the terminals of the second terminal group TG2 can be connected to each other via a short signal path. Consequently, a length of a signal line for the oscillation signal OSCK can be reduced, and thus parasitic capacitance present in the signal line for the oscillation signal OSCK can be reduced. Therefore, it is possible to prevent a situation in which communication noise of the digital interface 30 is forwarded from the first terminal group TG1 to the signal line for the oscillation signal OSCK via a parasitic capacitor, and thus phase noise of the oscillation signal OSCK increases. It is also possible to prevent a situation in which clock noise of the clock signal generation circuit 160 is forwarded from the third terminal group TG3 to the signal line for the oscillation signal OSCK via the parasitic capacitor, and thus phase noise of the oscillation signal OSCK increases.

In the present embodiment, as the resonator XTAL, an oven type resonator having a thermostatic oven may be used. In this case, in FIG. 5, the fourth terminal group TG4 including an oven control terminal of the oven type resonator XTAL is disposed in the fourth terminal region AT4 along the fourth side SD4. For example, an oven control terminal such as a heater control voltage output terminal or a temperature sensor connection terminal is disposed in the fourth terminal region AT4 as the fourth terminal group TG4.

In the above-described way, in a case where the first, second and third terminal groups TG1, TG2 and TG3 for the digital interface 30, the oscillation circuit 150, and the clock signal generation circuit 160 are respectively disposed in the first, second and third terminal regions AT1, AT2 and AT3, the fourth terminal group TG4 including the oven control terminal can be disposed by effectively using the remaining fourth terminal region AT4. In other words, since the first, second and third terminal groups TG1, TG2 and TG3 are respectively disposed in the first, second and third terminal regions AT1, AT2 and AT3, phase noise can be reduced as described above, and since the fourth terminal group TG4 including the oven control terminal is disposed in the remaining fourth terminal region AT4, oven control on the oven type resonator XTAL can be realized.

The circuit device of the present embodiment includes the oven control circuit 190 which is connected to the oven control terminal of the fourth terminal group TG4, and performs oven control on the oven type resonator XTAL. In FIG. 5, the oven control circuit 190 is disposed on the fourth direction DR4 side of the fourth terminal region AT4.

In the above-described way, the oven control circuit 190 and the oven control terminal of the fourth terminal group TG4 can be connected to each other via a short signal path, and thus it is possible to realize more appropriate oven control. For example, it is assumed that as the oven control terminal, a heater control voltage output terminal or a temperature sensor connection terminal is provided. In this case, since the oven control circuit 190 is disposed on the fourth direction DR4 side of the fourth terminal region AT4, a length of a signal wire connecting the oven control circuit 190 to the heater control voltage output terminal or a length of a signal wire connecting the oven control circuit 190 to the temperature sensor connection terminal can be reduced. Therefore, since parasitic capacitance or the like of such a signal wire can be reduced, it is possible to reduce an adverse effect exerted on oven control by the parasitic capacitance and thus to realize more appropriate oven control.

In FIG. 5, the oscillation circuit 150 is disposed between the oven control circuit 190 and the second terminal region AT2. For example, the oven control circuit 190 is disposed on the fourth direction DR4 side of the fourth terminal region AT4, the oscillation circuit 150 is disposed on the fourth direction DR4 side of the oven control circuit 190, and the second terminal region AT2 is disposed on the fourth direction DR4 side of the oscillation circuit 150.

Consequently, the oven control circuit 190 and the oscillation circuit 150 can be layout-arranged by effectively using the region between the fourth terminal region AT4 and the second terminal region AT2. Therefore, the oven control circuit 190 and the fourth terminal group TG4 can be connected to each other via a short path, the oscillation circuit 150 and the second terminal group TG2 can be connected to each other via a short path, and the oven control circuit 190 and the oscillation circuit 150 can be effectively layout-arranged in the region between the fourth terminal region AT4 and the second terminal region AT2. Therefore, it is possible to simultaneously achieve a reduction of phase noise and a reduction of a layout area of the circuit device.

In the present embodiment, the processor 50 performs a process of estimating a true value of the frequency control data DFCI through a Karman filter process, and performs aging correction on the frequency control data DFCI on the basis of the estimated true value.

As mentioned above, if a true value of the frequency control data DFCI is estimated through the Karman filter process, and aging correction is performed on the basis of the estimated true value, it is possible to considerably improve the accuracy of aging correction. In other words, it is possible to realize aging correction in which the influence of observation noise or system noise is taken into consideration.

More specifically, in a case where a hold-over state is detected, the processor 50 holds a true value at a timing corresponding to a timing of detecting the hold-over state. A timing of holding the true value may be a timing of detecting the hold-over state, and may be a timing before the timing. The processor 50 performs a predetermined calculation process on the basis of the true value so as to generate the frequency control data DFCQ having undergone aging correction. The generated frequency control data DFCQ is output to the oscillation signal generation circuit 140. The process of generating the frequency control data DFCQ having undergone aging correction is performed by the aging corrector 56.

For example, in a normal operation period, the processor 50 performs a signal process such as a temperature compensation process on the frequency control data DFCI based on a phase comparison result from the phase comparator 41, or the frequency control data DFCI which is input from the external frequency control data generator 200, and outputs the frequency control data DFCQ having undergone the signal process to the oscillation signal generation circuit 140. The oscillation signal generation circuit 140 generates the oscillation signal OSCK by using the frequency control data DFCQ from the processor 50 and the resonator XTAL, and outputs the generated oscillation signal OSCK to the internal frequency control data generator 40 (phase comparator 41) or the external frequency control data generator 200. Consequently, a loop of a PLL circuit is formed by the frequency control data generator 40 (or the phase comparator 41) or the external frequency control data generator 200 and the oscillation signal generation circuit 140, and can thus generate the accurate oscillation signal OSCK phase-synchronized with the reference signal RFCK.

In the present embodiment, even in the normal operation period before a hold-over state is detected, the Karman filter 54 of the processor 50 operates to perform a Karman filter process on the frequency control data DFCI. In other words, a process of estimating a true value for an observed value of the frequency control data DFCI through the Karman filter process is performed.

If a hold-over state is detected, a true value at a timing corresponding to a detection timing of the hold-over state is held in the processor 50. Specifically, the aging corrector 56 holds the true value. The aging corrector 56 performs a calculation process on the basis of the held true value so as to generate the frequency control data DFCQ having undergone aging correction.

In the above-described way, aging correction is performed on the basis of the true value at the timing corresponding to the timing of detecting the hold-over state, and thus it is possible to considerably improve the accuracy of the aging correction. In other words, it is possible to realize aging correction in which the influence of observation noise or system noise is taken into consideration.

The processor 50 performs a calculation process (a calculation process of compensating for a frequency change caused by aging) of adding a correction value to the held true value, and thus generates the frequency control data DFCQ having undergone aging correction. For example, correction values (correction values for canceling a frequency change at an aging rate) corresponding to the aging rate (an aging gradient or an aging coefficient) are sequentially added to the true value at the timing corresponding to the detection timing of the hold-over state every predetermined timing, and thus the frequency control data DFCQ having undergone aging correction is generated. The addition process in the present embodiment includes a subtraction process of adding a negative value.

For example, a correction value at a time step k is indicated by D(k), and frequency control data having undergone aging correction is indicated by AC(k). In this case, the processor 50 obtains frequency control data AC(k+1) having undergone aging correction at a time step k+1 according to AC(k+1)=AC(k)+D(k). The processor 50 performs such a process of adding the correction value D(k) at each time step till a recovery timing (cancel timing) from the time of hold-over.

The processor 50 performs a calculation process of adding a correction value having undergone a filter process to the true value. For example, a filter process such as a low-pass filter process is performed on the correction value D(k), and a calculation process of sequentially adding correction value D'(k) having undergone the filter process to the true value is performed. Specifically, a calculation process is performed according to AC(k+1)=AC(k)+D'(k).

The processor 50 obtains the correction value on the basis of an observation residual in the Karman filter process. For example, the processor 50 performs a process of estimating a correction value in aging correction on the basis of an observation residual in a period before a hold-over state is detected. For example, if an observation residual is indicated by ek, the correction value D(k) is estimated by performing a process according to D(k)=D(k−1)+E·ek. Here, E is, for example, a constant, but a Karman gain may be used instead of the constant E. A correction value at a timing corresponding to a detection timing of a hold-over state is held, a calculation process of adding the held correction value to the true value, and thus the frequency control data DFCQ having undergone aging correction is generated.

Figure 6:
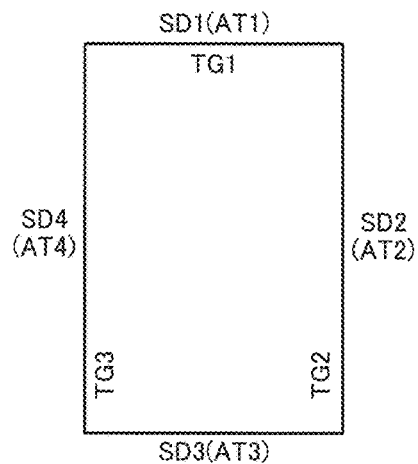
FIG. 6 is a diagram illustrating another layout arrangement configuration example of the circuit device according to an embodiment of the invention.

A technique of arranging the terminal groups in the present embodiment may be variously modified as illustrated in FIGS. 6 to 10. For example, in FIG. 6, the terminal group TG1 is disposed in the terminal region AT1 along the side SD1, and the terminal group TG3 is disposed in the terminal region AT4 along the side SD4. The terminal group TG2 is disposed in the terminal region AT2 along the side SD2. The terminal group TG3 may be disposed to be distributed to the terminal region AT4 and the terminal region AT3 (disposed on both sides). Similarly, the terminal group TG2 may be disposed to be distributed to the terminal region AT2 and the terminal region AT3. As illustrated in FIG. 6, the terminal groups TG2 and TG3 are preferably disposed further toward the side SD3 than the side SD1. In the above-described way, distances between the terminal group TG1 and the terminal groups TG2 and TG3 can be further lengthened.

Figure 7:
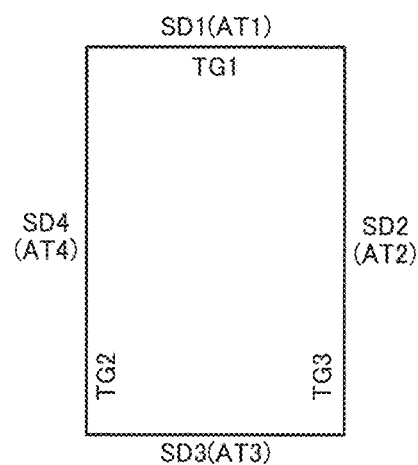
FIG. 7 is a diagram illustrating still another layout arrangement configuration example of the circuit device according to an embodiment of the invention.

In FIG. 7, conversely to the arrangement illustrated in FIG. 6, the terminal group TG3 is disposed in the terminal region AT2, and the terminal group TG2 is disposed in the terminal region AT4. In other words, in FIG. 5 or the like, in a plan view which is viewed from a direction intersecting a board (semiconductor board) of the circuit device (a plan view viewed from a region side in which transistors are formed), the side SD2 is a right side, and the side SD4 is a left side, but the side SD2 may be a left side, and the side SD4 may be a right side. Similarly, the sides SD1 and SD3 are not necessarily required to be an upper side and a lower side.

Figure 8:
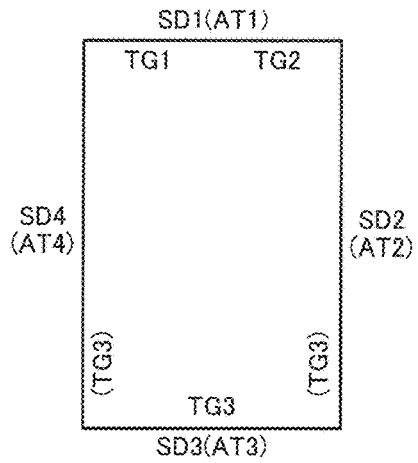
FIG. 8 is a diagram illustrating still another layout arrangement configuration example of the circuit device according to an embodiment of the invention.

In FIG. 8, the terminal groups TG1 and TG2 are disposed in the terminal region AT1, and the terminal group TG3 is disposed in the terminal region AT3. In other words, the terminal group TG2 may be disposed in terminal regions other than the terminal region AT2. In this case, the terminal group TG3 may be disposed in the terminal region AT2 or the terminal region AT4.

Figure 9:
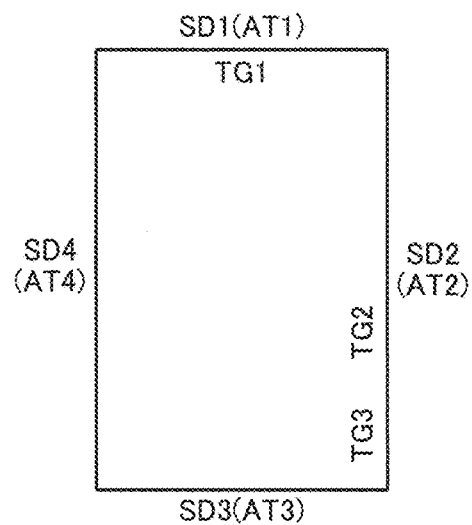
FIG. 9 is a diagram illustrating still another layout arrangement configuration example of the circuit device according to an embodiment of the invention.
Figure 10:
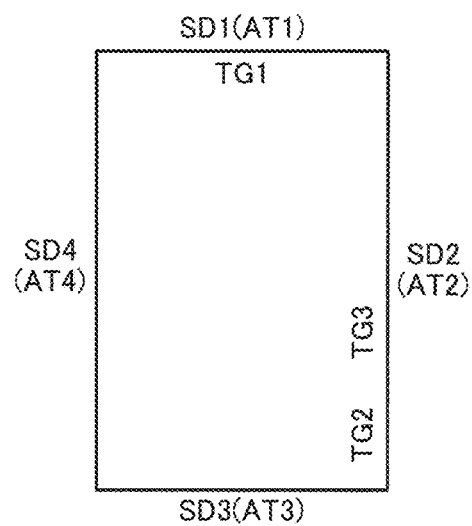
FIG. 10 is a diagram illustrating still another layout arrangement configuration example of the circuit device according to an embodiment of the invention.

In FIGS. 9 and 10, the terminal group TG1 is disposed in the terminal region AT1, and the terminal group TG2 and the terminal group TG3 are disposed in the terminal region AT2. In FIG. 9, the terminal group TG3 is disposed in a region which is farther from the terminal group TG1 than the terminal group TG2. In FIG. 10, the terminal group TG2 is disposed in a region which is farther from the terminal group TG1 than the terminal group TG3. The terminal group TG2 and the terminal group TG3 may be disposed in the terminal region AT4 or the terminal region AT3.

As mentioned above, in the present embodiment, the terminal group TG1 for connection of the digital interface 30 is disposed in the terminal region AT1, and the terminal group TG3 for connection of the clock signal generation circuit 160 is disposed in any one of the terminal regions AT2, AT3 and AT4. The terminal group TG2 for connection of the oscillation circuit 150 is disposed in a terminal region which is different from a terminal region in which the terminal group TG1 or the terminal group TG3 is disposed. As in FIGS. 9 and 10, a modification may occur in which the terminal groups TG2 and TG3 are disposed in the same terminal region.

4. Clock Signal Generation Circuit

Figure 11:
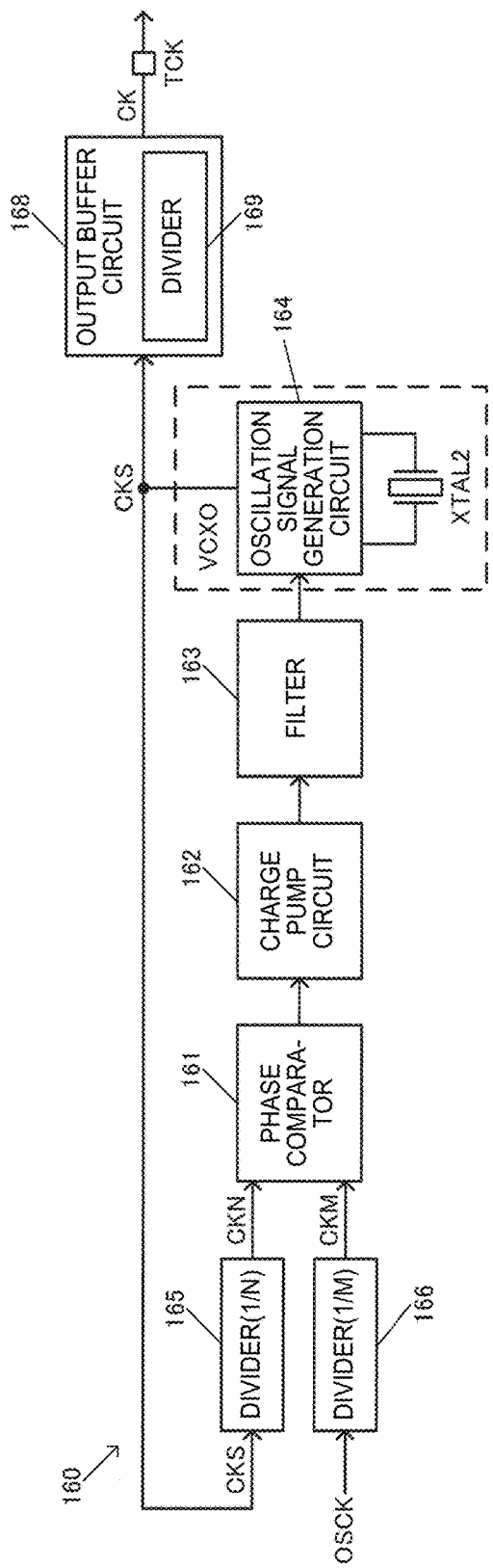
FIG. 11 is a diagram illustrating a first configuration example of a clock signal generation circuit.

FIG. 11 illustrates a first configuration example of the clock signal generation circuit 160. The clock signal generation circuit 160 in FIG. 11 includes the phase comparator 161, a charge pump circuit 162, a filter 163, dividers 165 and 166, and the output buffer circuit 168. In FIG. 11, an oscillator VCXO formed of an oscillation signal generation circuit 164 and a resonator XTAL2 is provided outside the circuit device. A loop of a PLL circuit is formed by using the oscillator VCXO which is provided as an externally attached component. However, there may be the occurrence of a modification in which the oscillation signal generation circuit 164 or the like is provided inside the circuit device.

A clock signal CKS generated by the oscillation signal generation circuit 164 of the clock signal generation circuit 160 is input to the divider 165. The divider 165 outputs a clock signal CKN having a frequency obtained by multiplying a frequency of the clock signal CKS by 1/N. The oscillation signal OSCK generated by the oscillation signal generation circuit 140 illustrated in FIGS. 1 and 2 is input to the divider 166 as a reference signal. The divider 166 outputs a clock signal CKM having a frequency obtained by multiplying a frequency of the oscillation signal OSCK by 1/M. The phase comparator 161 performs phase comparison between the clock signals CKN and CKM, so as to output an up or down pulse signal as a phase comparison result. The charge pump circuit 162 converts the up or down pulse signal into an up or down current signal which is then output to the filter 163. The filter 163 converts the up or down current signal into a DC voltage which is then output to the oscillation signal generation circuit 164 as an oscillation control voltage. The oscillation signal generation circuit 164 generates the clock signal CKS having a frequency set by the oscillation control voltage. The clock signal CKS is buffered by the output buffer circuit 168, and is output to an external device via an output terminal TCK as the clock signal CK. In this case, clock division is performed in a divider 169. The output terminal TCK is a terminal including the terminal group TG3 illustrated in FIG. 5.

In the above-described way, the clock signal generation circuit 160 generates the clock signal CK having a frequency obtained through multiplication of an oscillation frequency of the oscillation signal OSCK. In this case, a multiplication number is set on the basis of multiplication ratios of the dividers 165, 166 and 169.

Figure 12:
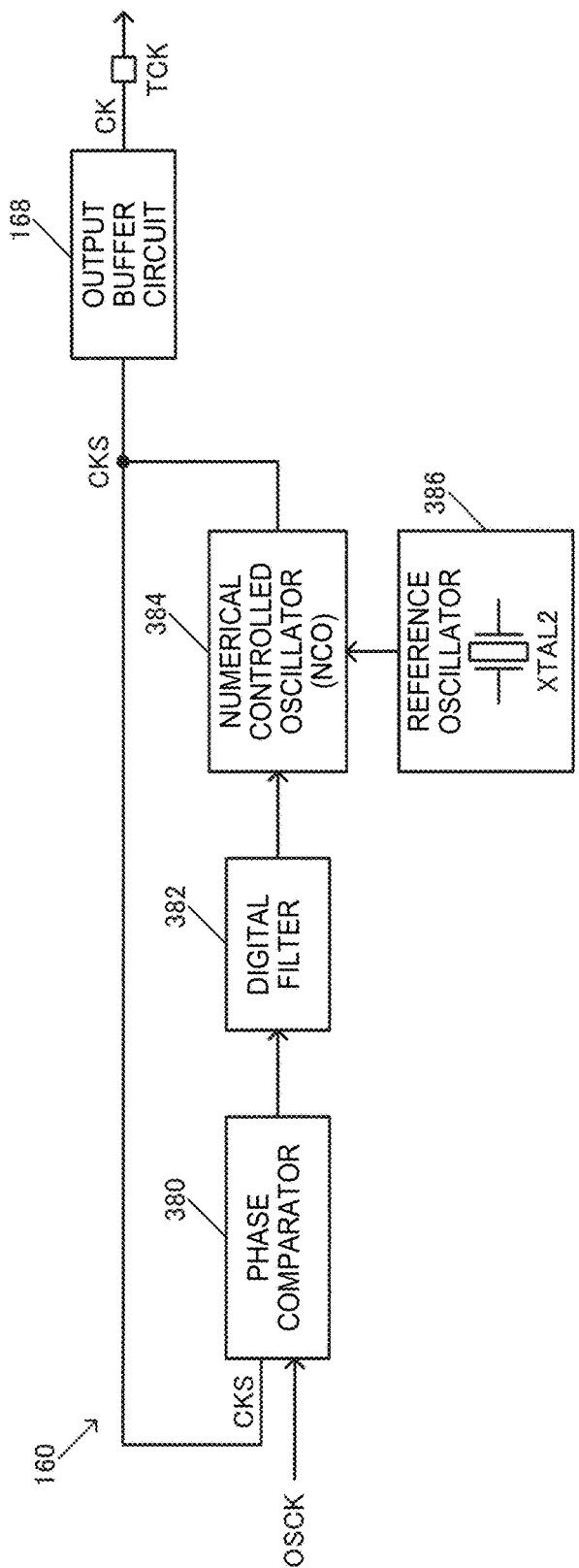
FIG. 12 is a diagram illustrating a second configuration example of a clock signal generation circuit.

FIG. 12 illustrates a second configuration example of the clock signal generation circuit 160. The clock signal generation circuit 160 in the second configuration example is implemented by a direct digital synthesizer type PLL circuit.

A phase comparator 380 (comparison calculator) performs phase comparison (comparison calculation) between the oscillation signal OSCK serving as a reference signal and the clock signal CKS. A digital filter 382 performs a smoothing process on phase errors. A configuration and an operation of the phase comparator 380 are the same as those of the phase comparator 41 illustrated in FIG. 2, and may include a counter or a time digital converter (TDC). The digital filter 382 corresponds to the digital filter 44 illustrated in FIG. 2. A numerical controlled oscillator 384 is a circuit which digitally synthesizes any frequency or waveform by using a reference oscillation signal from a reference oscillator 386 having the resonator XTAL2. In other words, instead of controlling an oscillation frequency on the basis of a control volume from a D/A converter, such as a VCO, the clock signal CKS having any oscillation frequency is generated through a digital calculation process by using digital frequency control data and the reference oscillator 386 (resonator XTAL2). The clock signal CKS is buffered by the output buffer circuit 168, and is output to an external device via the output terminal TCK as the clock signal CK. A direct digital synthesizer type ADPLL circuit can be implemented by using the configuration illustrated in FIG. 12.

The clock signal generation circuit 160 may not include all circuit elements for causing the resonator XTAL to oscillate. For example, there may be a configuration in which some circuit elements are formed by using discrete components provided outside the circuit device 500, and are connected to the clock signal generation circuit 160 via the third terminal group TG3.

5. Temperature Sensor and Oscillation Circuit

Figure 13:
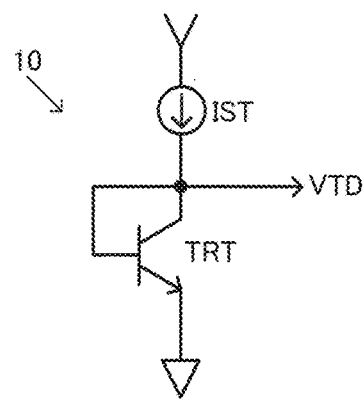
FIG. 13 is a diagram illustrating a configuration example of a temperature sensor.

FIG. 13 illustrates a configuration example of the temperature sensor 10. The temperature sensor 10 illustrated in FIG. 13 includes a current source IST, and a bipolar transistor TRT having a collector to which a current from the current source IST is supplied. The bipolar transistor TRT has a diode connection in which the collector is connected to a base thereof, and thus the temperature detection voltage VTD having temperature characteristics is output to a node of the collector of the bipolar transistor TRT. The temperature characteristics of the temperature detection voltage VTD are caused by temperature dependency of a voltage between the base and an emitter of the bipolar transistor TRT. The temperature detection voltage VTD from the temperature sensor 10 has, for example, negative temperature characteristics (first-order temperature characteristics with a negative gradient).

Figure 14:
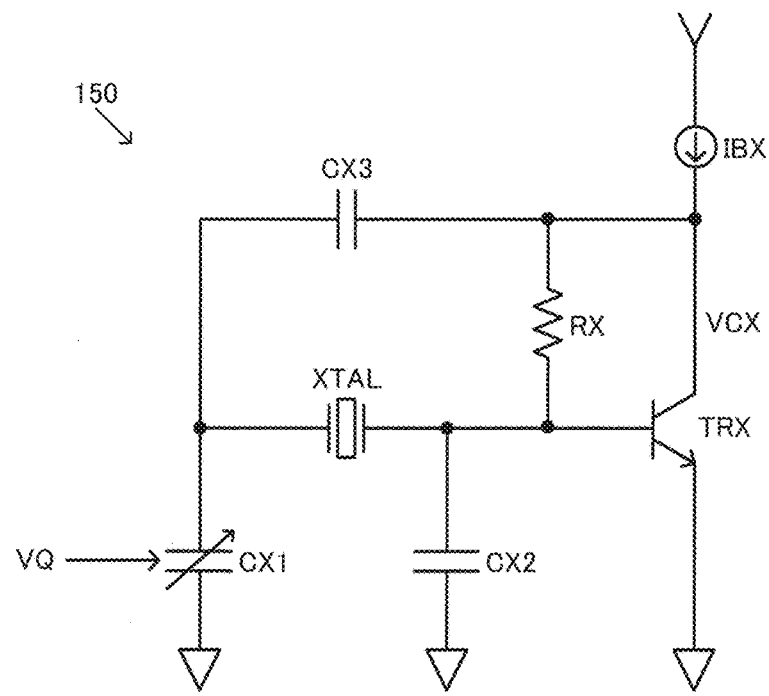
FIG. 14 is a diagram illustrating a configuration example of an oscillation circuit.

FIG. 14 illustrates a configuration example of the oscillation circuit 150. The oscillation circuit 150 includes a current source IBX, a bipolar transistor TRX, a resistor RX, a variable capacitance capacitor CX1, and capacitors CX2 and CX3.

The current source IBX supplies a bias current to a collector of the bipolar transistor TRX. The resistor RX is provided between the collector and a base of the bipolar transistor TRX.

One end of the variable capacitance capacitor CX1 whose capacitance is variable is connected to a resonator XTAL. Specifically, one end of the variable capacitance capacitor CX1 is connected to one end of the resonator XTAL via a first resonator terminal (resonator pad) of the circuit device. One end of the capacitor CX2 is connected to the other end of the resonator XTAL. Specifically, one end of the capacitor CX2 is connected to the other end of the resonator XTAL via a second resonator terminal (resonator pad) of the circuit device. One end of the capacitor CX3 is connected to one end of the resonator XTAL, and the other end thereof is connected to the collector of the bipolar transistor TRX. The first and second resonator terminals are terminals included in the second terminal group TG2 illustrated in FIG. 5.

A base-emitter current caused by oscillation of the resonator XTAL flows through the bipolar transistor TRX. If the base-emitter current increases, a current between the collector and the emitter of the bipolar transistor TRX increases, and thus a bias current which branches to the resistor RX from the current source IBX is reduced so that a collector voltage VCX is reduced. On the other hand, if a current between the base and the emitter of the bipolar transistor TRX is reduced, a collector-emitter current is reduced, and thus a bias current which branches to the resistor RX from the current source IBX increases so that the collector voltage VCX is heightened. The collector voltage VCX is fed back to the resonator XTAL via the capacitor CX3.

An oscillation frequency of the resonator XTAL has temperature characteristics, and the temperature characteristics are compensated by the output voltage VQ (frequency control voltage) from the D/A converter 80. In other words, the output voltage VQ is input to the variable capacitance capacitor CX1, and thus a capacitance value of the variable capacitance capacitor CX1 is controlled by the output voltage VQ. If the capacitance value of the variable capacitance capacitor CX1 changes, a resonance frequency of an oscillation loop changes, and thus a variation in an oscillation frequency due to the temperature characteristics of the resonator XTAL is compensated for. The variable capacitance capacitor CX1 is implemented by, for example, a variable capacitance diode (varactor).

A configuration of the oscillation circuit 150 of the present embodiment is not limited to the configuration illustrated in FIG. 14, and may be variously modified. For example, in FIG. 14, the capacitor CX1 is used as a variable capacitance capacitor, but the capacitors CX2 or CX3 may be used as a variable capacitance capacitor which is controlled by the output voltage VQ. Some of the plurality of capacitors CX1 to CX3 may be used as variable capacitance capacitors which are controlled by the output voltage VQ.

The oscillation circuit 150 may not include all circuit elements for causing the resonator XTAL to oscillate. For example, there may be a configuration in which some circuit elements are formed by using discrete components provided outside the circuit device 500, and are connected to the oscillation circuit 150 via the second terminal group TG2.

Figure 15:
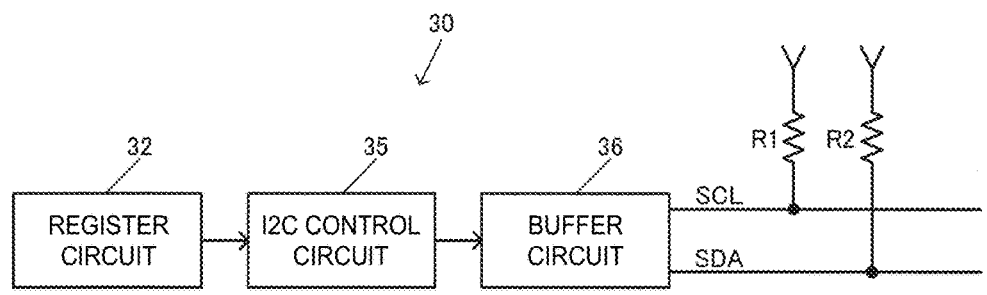
FIG. 15 is a diagram illustrating a first configuration example of a digital interface.

6. Digital Interface, Reference Signal Generation Circuit, and Oven Control Circuit FIG. 15 illustrates a first configuration example of the digital interface 30. The digital interface 30 illustrated in FIG. 15 is implemented by a 2-wire I2C type serial interface circuit, and includes an I2C control circuit 35 and a buffer circuit 36. Resistors R1 and R2 are pull-up resistors. The I2C method is a synchronous serial communication method of performing communication by using two signal lines such as a serial clock line SCL and a bidirectional serial data line SDA. A plurality of slaves are connected to an I2C bus, a master designates a separately set address of a slave so as to select the slave, and then performs communication with the slave.

Figure 16:
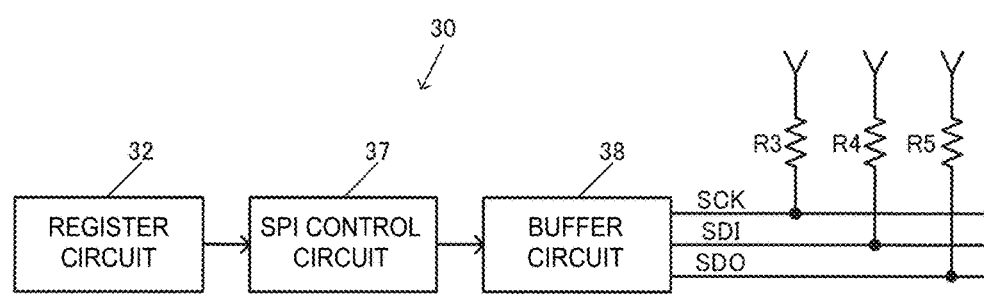
FIG. 16 is a diagram illustrating a second configuration example of a digital interface.

FIG. 16 illustrates a second configuration example of the digital interface 30. The digital interface 30 illustrated in FIG. 16 is implemented by a 3-wire or 4-wire SPI type serial interface circuit, and includes an SPI control circuit 37 and a buffer circuit 38. Resistors R3, R4 and R5 are pull-up resistors. The SPI method is a synchronous serial communication method of performing communication by using a serial clock line SCK and two unidirectional serial data lines SDI and SDO. A plurality of slaves are connected to a SPI bus, and a master is required to select a slave by using a slave select line in order to specify the slave.

Figure 17:
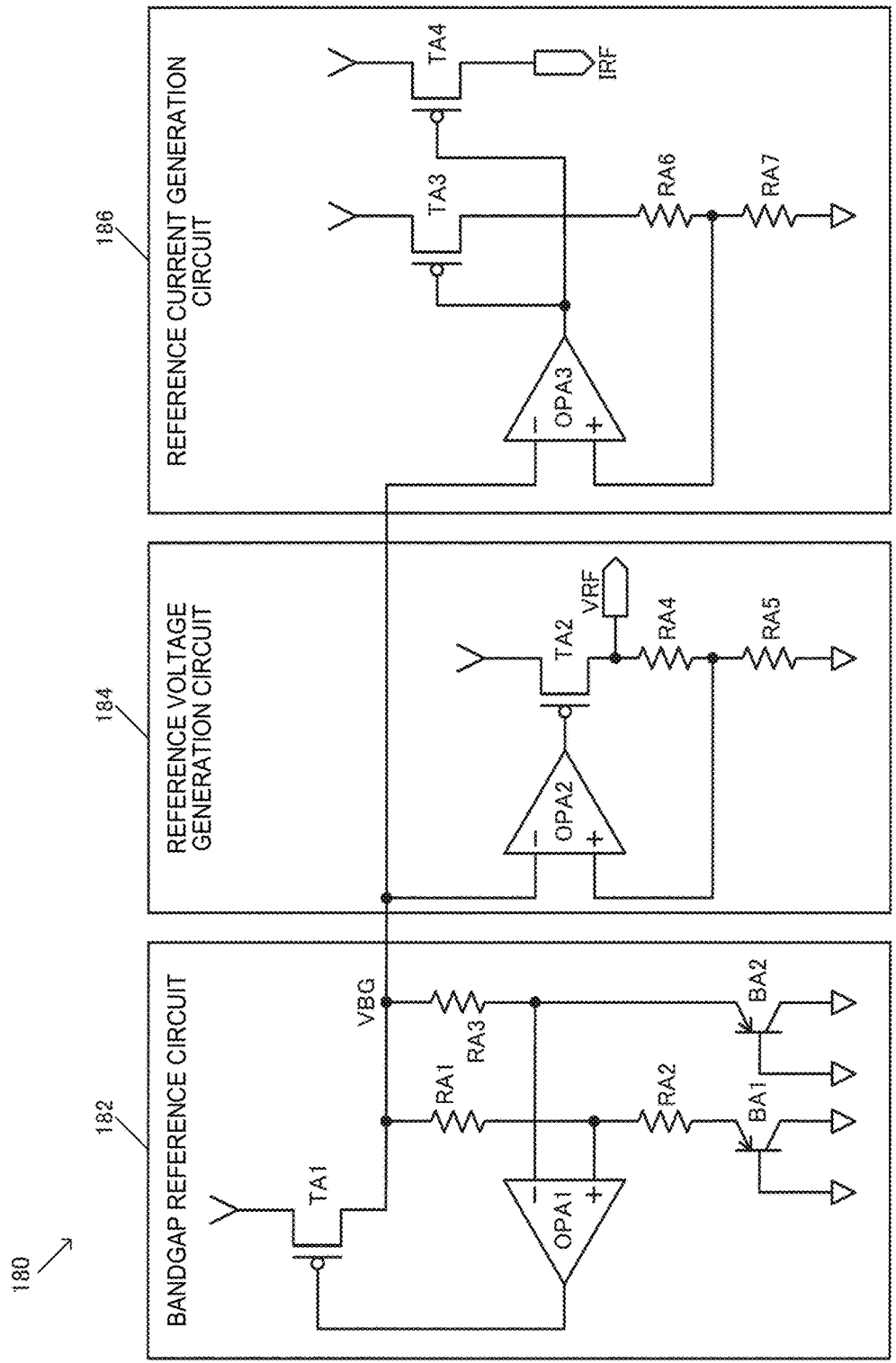
FIG. 17 is a diagram illustrating a configuration example of a reference signal generation circuit.

FIG. 17 illustrates a configuration example of the reference signal generation circuit 180. The reference signal generation circuit 180 includes a bandgap reference circuit 182, a reference voltage generation circuit 184, and a reference current generation circuit 186. The bandgap reference circuit 182 includes an operational amplifier OPA1, bipolar transistors BA1 and BA2, a transistor TA1, and resistors RA1, RA2 and RA3, and generates a constant voltage VBG which is a bandgap reference voltage. Each of the bipolar transistors BA1 and BA2 has a diode connection in which a collector is connected to an emitter thereof. The bandgap reference circuit 182 cancels temperature-dependency of a bandgap voltage by using the bipolar transistors BA1 and BA2, and thus generates the constant voltage VBG which is constant with respect to a temperature change.

The reference voltage generation circuit 184 includes an operational amplifier OPA2, a transistor TA2, and resistors RA4 and RA5. A reference voltage VRF is generated to satisfy $VRF=VBG\times\{(RA4+RA5)/RA5\}$. The reference current generation circuit 186 includes an operational amplifier OPA3, transistors TA3 and TA4, and resistors RA6 and RA7. A constant current IRF is generated on the basis of the constant voltage VBG.

Figure 18:
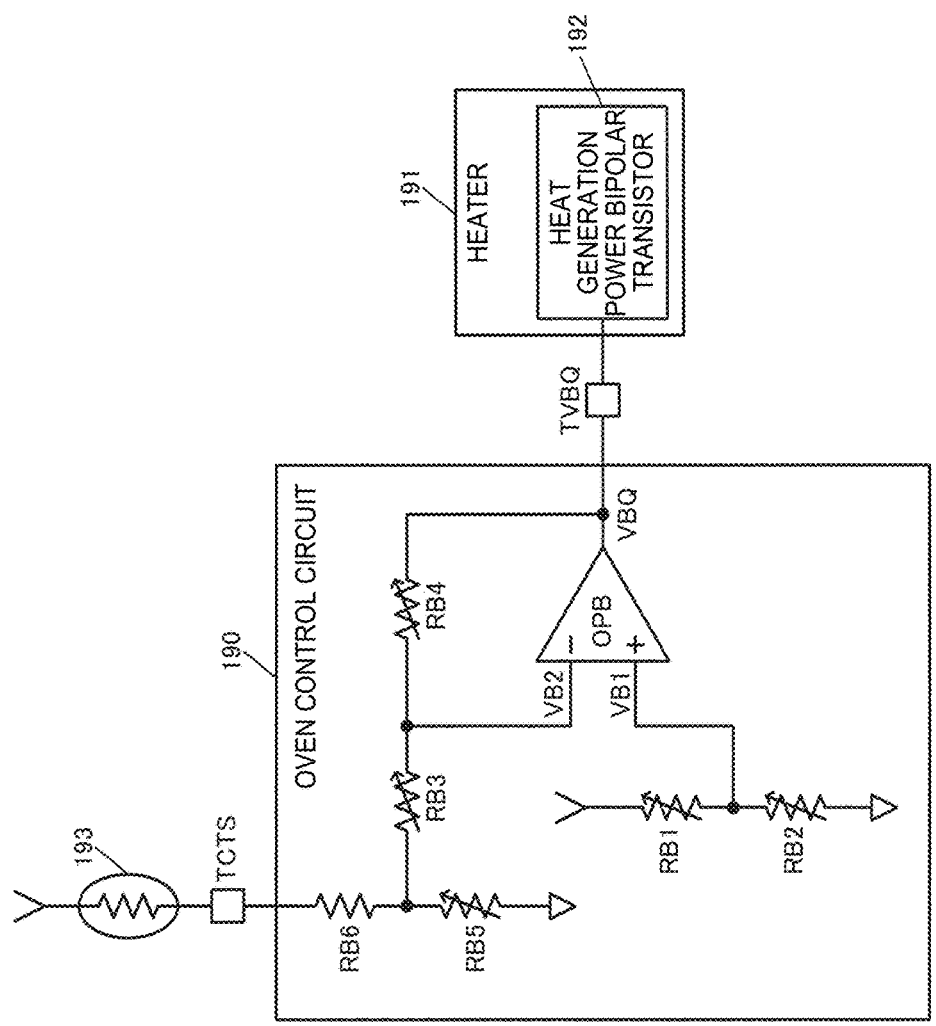
FIG. 18 is a diagram illustrating a configuration example of an oven control circuit.

FIG. 18 illustrates a configuration example of the oven control circuit 190. The oven control circuit 190 includes an operational amplifier OPB and resistors RB1 to RB6. The resistors RB1 to RB5 are resistors whose resistance values are controlled to be variable.

A temperature sensor 193 is a temperature sensor for oven control, and is a temperature sensor (the reference numeral 460 or 462 in FIG. 32 which will be described later) provided inside an oscillator. In FIG. 18, the temperature sensor 193 is implemented by a thermistor.

The temperature sensor 193 is connected to the oven control circuit 190 via a connection terminal TCTS. The connection terminal TCTS is a terminal included in the fourth terminal group TG4 illustrated in FIG. 5.

A voltage VB1 for setting an oven temperature is generated through resistance division of a power supply voltage using the resistors RB1 and RB2. A resistance value of the thermistor which is the temperature sensor 193 changes depending on an oven temperature of the oscillator, and thus a voltage VB2 changes. An operational amplifier OPB operates so that the voltage VB2 becomes the same as the voltage VB1 for setting an oven temperature through virtual grounding, and thus generates a heater control voltage VBQ.

The heater control voltage VBQ generated by the oven control circuit 190 is output to a heater 191 (the reference numeral 450 or 452 in FIG. 32) provided inside the oscillator via an output terminal TVBQ. The output terminal TVBQ is a terminal included in the fourth terminal group TG4 illustrated in FIG. 5. The heater 191 includes a heat generation power bipolar transistor 192 which is a heat generation element. A base voltage of the heat generation power bipolar transistor 192 is controlled on the basis of the heater control voltage VBQ, and thus heat generation control on the heater 191 is realized.

A configuration of the oven control circuit 190 is not limited to the configuration illustrated in FIG. 18. For example, the oven control circuit 190 may be applied to a circuit configuration including, as a heater control target, a heater having a configuration in which a diode is used as a temperature sensor, and a heat generation heat MOS transistor is provided as a heat generation element.

7. Oscillation Frequency Change Due to Aging

In an oscillator such as an OCXO or a TCXO, an oscillation frequency changes due to a secular change called aging. There is a difference in a behavior of aging change in an oscillation frequency between individual oscillators due to individual variations (hereinafter, referred to as element variations) in performance of a component forming an oscillator, a mounting state of a component or an oscillator, or a use environment of an oscillator.

Figure 19:
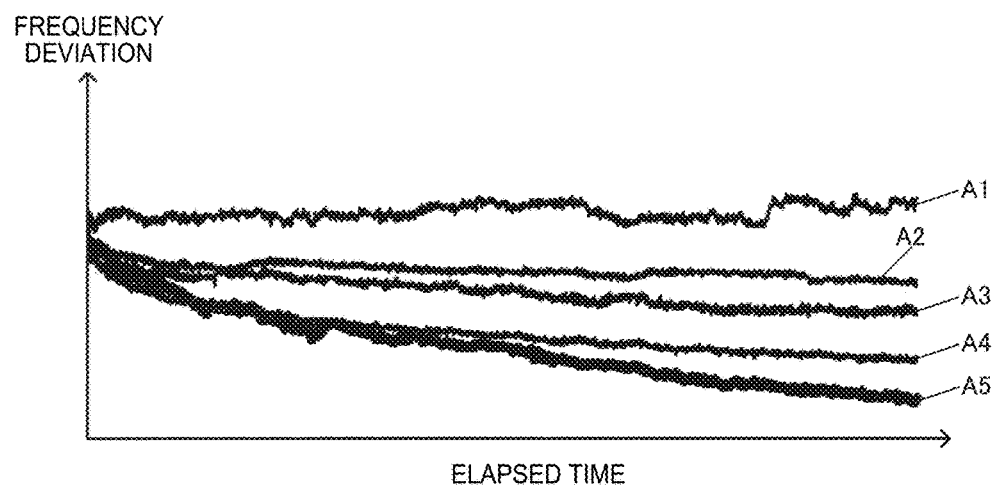
FIG. 19 is a diagram for explaining element variations in aging characteristics.

A1 to A5 in FIG. 19 indicate examples of measurement results of aging characteristics of a plurality of oscillators whose shipment lots are the same as or different from each other. As indicated by A1 to A5 in FIG. 19, there are differences caused by element variations in aspects of aging change.

As causes of an oscillation frequency change due to aging, there may be attachment and detachment of dust to and from an oscillator in an airtight sealing container, an environmental change caused by a certain outgas, or a secular change of an adhesive used in an oscillator.

Regarding a countermeasure for reducing an oscillation frequency change due to aging, there is a method in which initial aging is performed so that an oscillator is operated for a predetermined period before shipment thereof, and thus an oscillation frequency is initially changed. However, in an application requiring high frequency stability, only such an initial aging countermeasure is not sufficient, and aging correction for compensating for an oscillation frequency change due to aging is desirable.

In a case where an oscillator is used as a reference signal source of a base station, there is a problem such as so-called hold-over. For example, in a base station, an oscillation signal (output signal) from an oscillator is synchronized with a reference signal from a GPS or a network by using a PLL circuit, and thus a frequency change is reduced. However, in a case where a hold-over state occurs in which the reference signal from a GPS or a network (Internet) is absent or abnormal, a reference signal for synchronization cannot be obtained.

If such a hold-over state occurs, an oscillation signal generated through self-running oscillation of an oscillator is used as a reference signal of a base station. Therefore, there is the need for hold-over performance of reducing an oscillation frequency change due to self-running oscillation of an oscillator in a hold-over period from an occurrence timing of the hold-over state to a recovery timing (cancel timing) from the hold-over state.

However, as described above, there is an oscillation frequency change in a level which cannot be ignored in an oscillator, and this causes a problem that it is hard to realize high hold-over performance. For example, in a case where an allowable frequency deviation (Δf/f) is specified in a hold-over period such as 24 hours, if a great oscillation frequency change occurs due to aging, there is concern that satisfy the allowable frequency deviation specification may not be satisfied.

For example, as a communication method between a base station and a communication terminal, various methods such as frequency division duplex (FDD) or time division duplex (TDD) have been proposed. In the TDD method, data is transmitted and received in a time division manner by using the same frequency in uplink and downlink, and a guard time is set between time slots allocated to respective apparatuses. Thus, it is necessary for each apparatus to perform time synchronization in order to realize appropriate communication, and thus an accurate absolute time is required to be measured.

Figure 20:
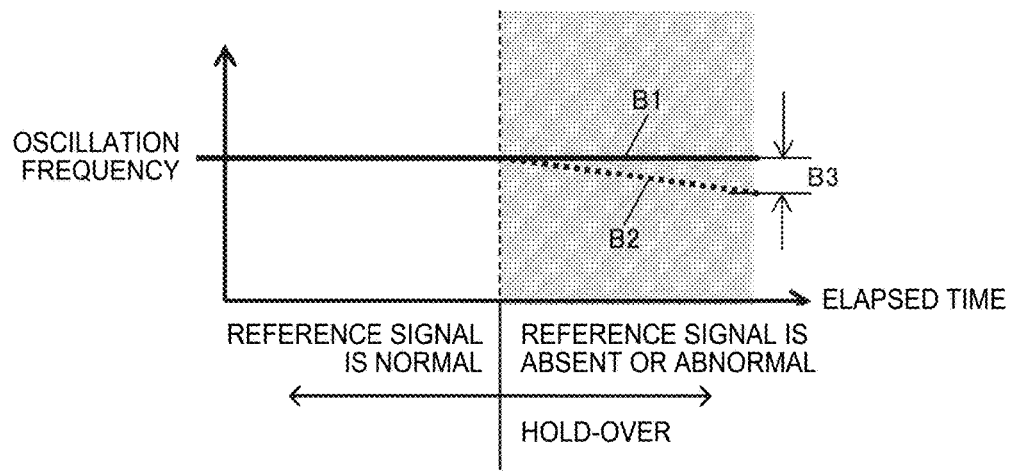
FIG. 20 is a diagram for explaining a hold-over state.
Figure 21:
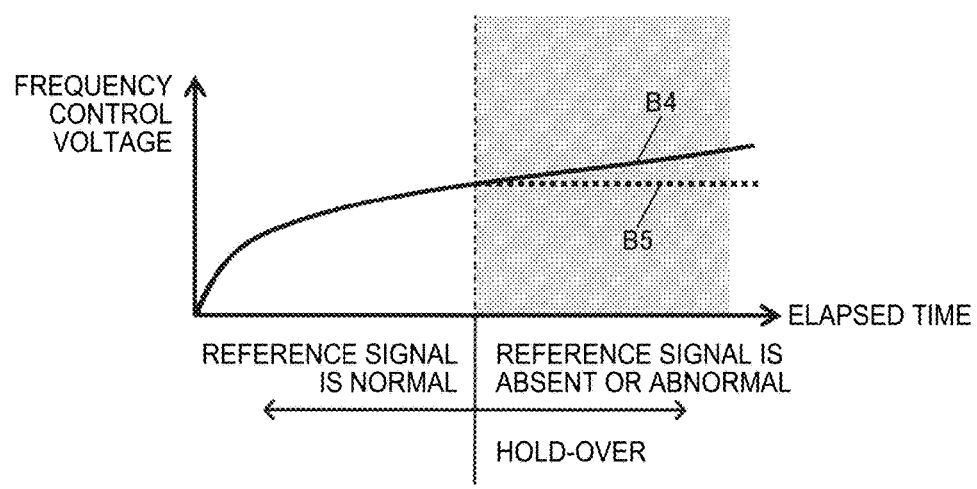
FIG. 21 is a diagram for explaining a hold-over state.

B1 in FIG. 20 indicates an aging characteristic of an ideal oscillation frequency in a case where a hold-over state occurs. On the other hand, B2 (dotted line) indicates a characteristic in which an oscillation frequency changes due to aging. B3 indicates a change width of the oscillation frequencies due to the aging. B4 in FIG. 21 indicates transition of a frequency control voltage for approaching the characteristic indicated by B1 in a case where a hold-over state occurs. On the other hand, B5 (dotted line) indicates a state in which the frequency control voltage is constant from the time at which the absence or abnormality of the reference signal occurs.

The aging correction is performed in order to cause the characteristic indicated by B2 in FIG. 20 to be close to the ideal characteristic indicated by B1. For example, if the reference value is changed as indicated by B4 in FIG. 21 through the aging correction, the characteristic indicated by B2 in FIG. 20 can be made to be close to the ideal characteristic indicated by B1, and thus the characteristic indicated by B2 can be corrected to the ideal characteristic indicated by B1 by increasing the correction accuracy. On the other hand, in a case where aging correction is not performed as indicated by B5 in FIG. 21, an oscillation frequency changes in a hold-over period as indicated by B2 in FIG. 20. Thus, for example, if a requirement for hold-over performance is B1 in FIG. 20, the requirement cannot be satisfied.

For example, the hold-over time $\theta_{tot}$ indicating a time deviation amount (total amount) based on an oscillation frequency change in a hold-over period may be expressed as in the following Equation (1).

$$\theta_{tot} = T_1 \times f_0 \times \frac{\Delta f}{f_0} \times \frac{1}{f_0} \times \frac{1}{2} \qquad (1)$$

$$= T_1 \times \frac{\Delta f}{f_0} \times \frac{1}{2}$$

$$\frac{\Delta f}{f_0} = \frac{2 \times \theta_{tot}}{T_1} \qquad (2)$$

Here, $T_1$ indicates elapsed time of aging due to hold-over. In addition, $f_0$ indicates a nominal oscillation frequency, and $\Delta f/f_0$ indicates a frequency deviation. In the above Equation (1), $T_1 \times f_0$ indicates a total number of clocks, and $(\Delta f/f_0) \times (1/f_0)$ indicates a timing deviation amount at one clock. The frequency deviation $\Delta f/f_0$ may be expressed as in the above Equation (2) by using the hold-over time $\theta_{tot}$ and the elapsed time $T_1$.

Here, the frequency deviation $\Delta f/f_0$ is assumed to linearly change with a constant inclination over time. In this case, as the elapsed time $T_1$ increases, the hold-over time $\theta_{tot}$ quadratically increases.

For example, in a case of a TDD method, in order to prevent time slots in which the guard time is set from overlapping each other, the hold-over time is required to be, for example, $\theta_{tot} < 1.5$ µs. Therefore, as is clear from the above Equation (2), an allowable frequency deviation $\Delta f/f_0$ in an oscillator is required to have a very small value. Particularly, this allowable frequency deviation is required to have a smaller value as the elapsed time $T_1$ increases. For example, in a case where the time defined as a period from an occurrence timing of a hold-over state to a recovery timing from the hold-over state through maintenance work is, for example, $T_1=24$ hours, a very small value has to be used as the allowable frequency deviation. The frequency deviation $\Delta f/f_0$ includes, for example, a temperature-dependent frequency deviation and a frequency deviation due to aging, and thus it is necessary to perform considerably highly accurate aging correction in order to satisfy the requirement.

8. Aging Correction Using Karman Filter Process

In the present embodiment, an aging correction technique using a Karman filter process is employed. Specifically, in the present embodiment, a true value for an observed value of frequency control data (oscillation frequency) is estimated through a Karman filter process in a period before a hold-over state is detected. In a case where a hold-over state is detected, a true value at a timing (time point) corresponding to a timing of detecting the hold-over state is held, a calculation process based on the true value is performed, and thus aging correction is realized.

Figure 22:
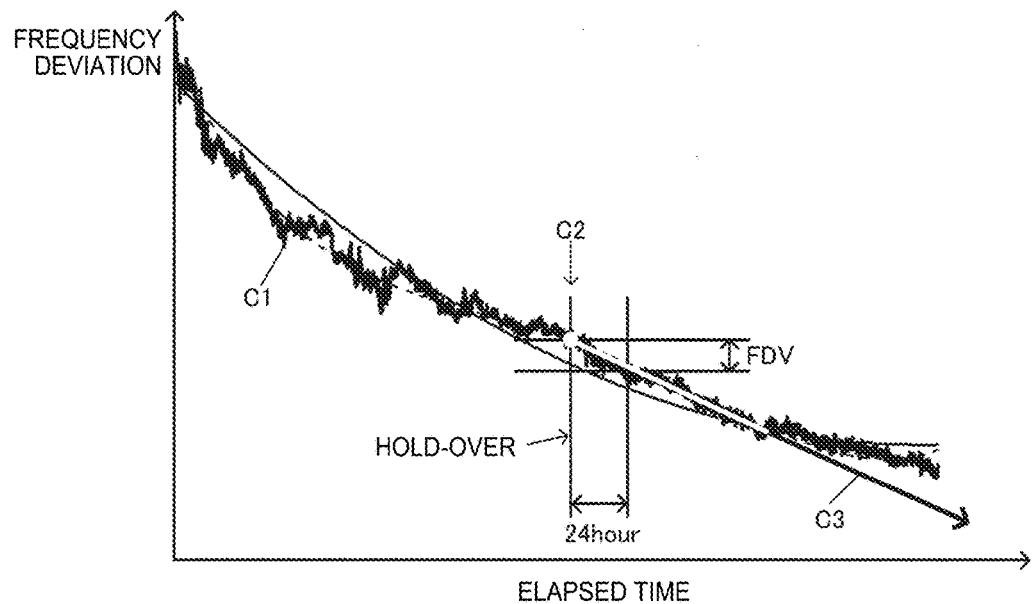
FIG. 22 is a diagram for explaining aging correction using a Karman filter process.

FIG. 22 is a diagram illustrating results of measuring an oscillation frequency change due to aging. A transverse axis expresses the elapsed time (aging time), and a longitudinal axis expresses the frequency deviation ($\Delta f/f_0$) of an oscillation frequency. As indicated by C1 in FIG. 22, there are large variations caused by system noise or observation noise in measured values which are observed values. These variations also include a variation caused by the environmental temperature.

In a situation in which there are large variations in the observed values, state estimation using a Karman filter process (for example, a linear Karman filter process) is performed in order to obtain an accurate true value.

Figure 23:
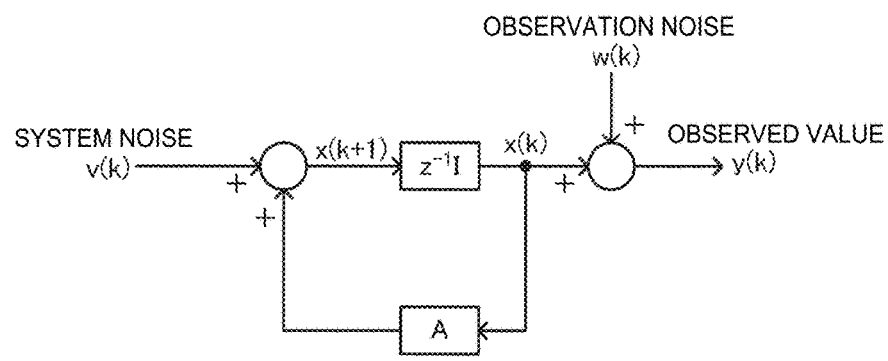
FIG. 23 is a diagram for explaining aging correction using a Karman filter process.

FIG. 23 illustrates a time-series state space model, and discrete time state equations of this model are given by a state equation and an observation equation of the following (3) and (4).

$$x(k+1)=A \cdot x(k)+v(k) \quad (3)$$

$$y(k)=x(k)+w(k) \quad (4)$$

Here, $x(k)$ indicates a state at a time point k, and $y(k)$ indicates an observed value. In addition, $v(k)$ indicates system noise, $w(k)$ indicates observation noise, and A is a system matrix. In a case where $x(k)$ indicates an oscillation frequency (frequency control data), A corresponds to, for example, an aging rate (aging coefficient). The aging rate indicates a change rate of the oscillation frequency with respect to the elapsed time.

For example, it is assumed that a hold-over state occurs at a timing indicated by C2 in FIG. 22. In this case, aging correction is performed on the basis of a true value $x(k)$ at the time point C2 at which the reference signal RFCK is stopped, and an aging rate (A) corresponding to an inclination indicated by C3 in FIG. 22. Specifically, as compensation (correction) for reducing a frequency change at the aging rate indicated by C3, aging correction of sequentially changing the true value $x(k)$ of the oscillation frequency (frequency control data) at the time point C2 with a correction value for canceling the frequency change is performed. In other words, the true value $x(k)$ is changed with a correction value for canceling a frequency change at the aging rate as indicated by B2 in FIG. 20 and causing an ideal characteristic as indicated by B1. In this way, for example, in a case where a hold-over period is 24 hours, FDV in FIG. 22 corresponding to an oscillation frequency change after 24 hours elapses can be compensated for through the aging correction.

Here, the oscillation frequency change (frequency deviation) indicated by C1 in FIG. 22 is caused by a temperature change and aging. Therefore, in the present embodiment, for example, an oven type oscillator (OCXO) having a thermostatic oven is employed, and thus an oscillation frequency change caused by a temperature change is minimized. A temperature compensation process for reducing an oscillation frequency change caused by a temperature change is performed by using the temperature sensor 10 or the like illustrated in FIG. 2.

In a period (normal operation period) in which the PLL circuit (the internal PLL circuit or the external PLL circuit) is synchronized with the reference signal RFCK, frequency control data is monitored, and a true value obtained by removing an error (system noise or observation noise) is obtained, and is held in the register. In a case where unlocking of the PLL circuit occurs due to the absence or abnormality of the reference signal RFCK, aging correction is performed on the basis of a true value (a true value for an observed value of frequency control data) held at the time of the unlocking. For example, regarding compensation for reducing a frequency change at the aging rate corresponding to an inclination indicated by C3 in FIG. 22, for example, a process of sequentially adding correction values for canceling the frequency change to the held true value of the frequency control data is performed, thus the frequency control data DFCQ during self-running oscillation in a hold-over period is generated, and the resonator XTAL is made to oscillate. In the above-described way, since a true value at the time of entering hold-over can be obtained at the minimum error, and aging correction can be performed, it is possible to realize hold-over performance in which an adverse effect due to an aging change is minimized.

9. Configuration of Processor

Figure 24:
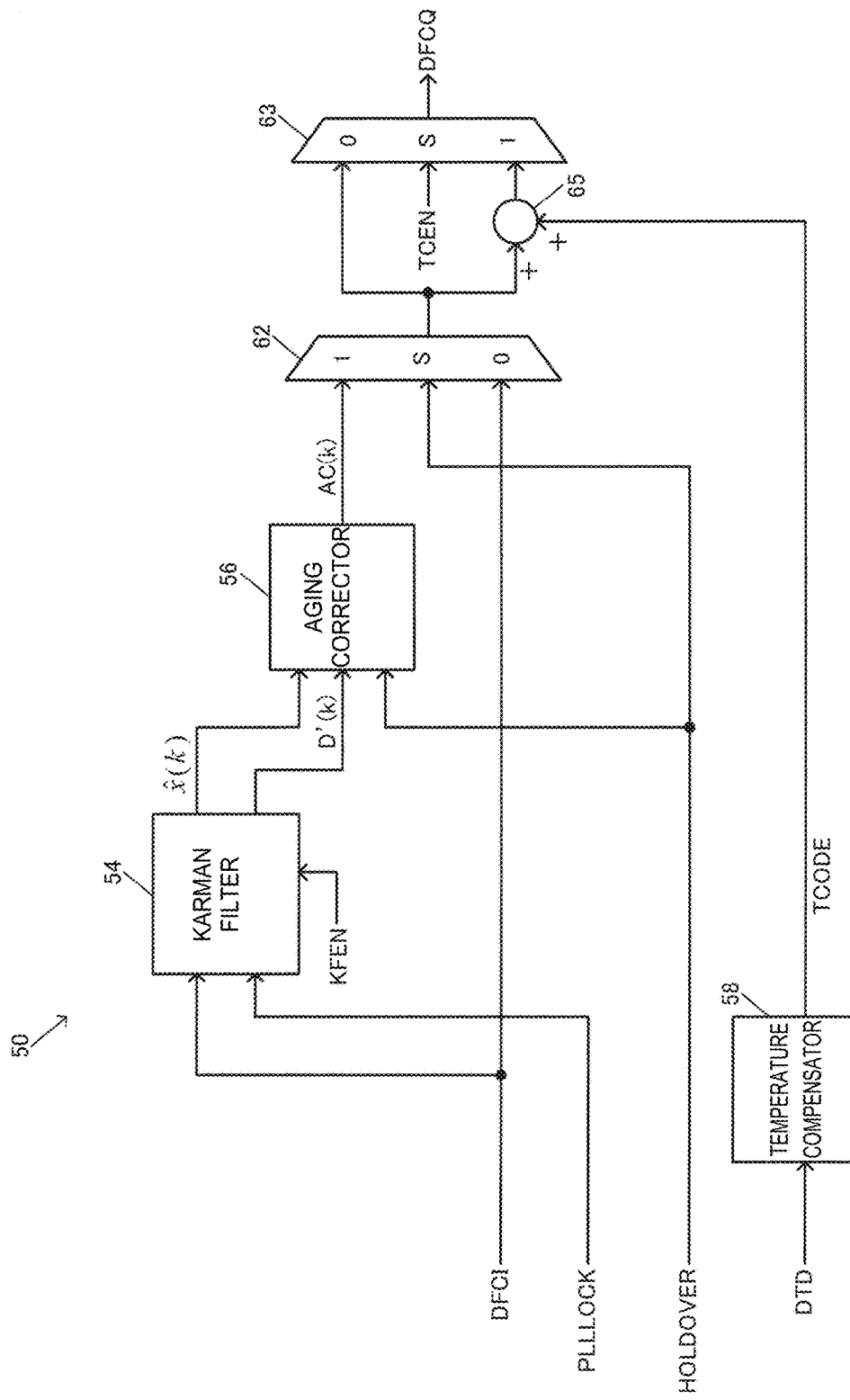
FIG. 24 is a diagram illustrating a detailed configuration example of a processor.

FIG. 24 illustrates a detailed configuration example of the processor 50. As illustrated in FIG. 24, the processor 50 includes the Karman filter 54, the aging corrector 56, the temperature compensator 58, selectors 62 and 63, and an adder 65.

The Karman filter 54 to which the frequency control data DFCI (frequency control data from which an environmental change component is removed) is input performs a Karman filter process. The Karman filter 54 outputs a post-estimated value $x\hat{}(k)$ corresponding to a true value estimated through the Karman filter process. In the present specification, the hat symbol "^" indicating an estimated value is arranged with two letters as appropriate.

The Karman filter process is a process in which, assuming that noise (errors) is included in an observed value and a variable indicating a state of a system, an optimal state of the system is estimated by using observed values acquired from the past to the present. Specifically, a state is estimated by repeatedly performing observation update (observation process) and time update (prediction process). The observation update is the process of updating a Karman gain, an estimated value, and an error covariance by using observed values and results of the time update. The time update is the process of predicting an estimated value and an error covariance at the next time point by using results of the observation update. In the present embodiment, a technique using a linear Karman filter process is focused, but an extended Karman filter process may be used. The Karman filter process of the present embodiment will be described later in detail.

The post-estimated value x^(k) and the correction value D'(k) are input to the aging corrector 56 from the Karman filter 54. The frequency control data AC(k) having undergone aging correction is generated by performing calculation process of adding the correction value D'(k) to the post-estimated value x^(k) corresponding to a true value of the frequency control data. Here, D'(k) is a correction value D(k) having undergone a filter process (a low-pass filter process). In other words, in a case where a correction value (a correction value having undergone a filter process) at a time step k (time point k) is indicated by D'(k), and frequency control data having undergone aging correction at the time step k is indicated by AC(k), the aging corrector 56 obtains frequency control data AC(k+1) having undergone aging correction at a time step k+1 (time point k+1) according to AC(k+1)=AC(k)+D'(k).

The temperature compensator 58 to which the temperature detection data DTD is input performs a temperature compensation process, and generates temperature compensation data TCODE (temperature compensation code) for maintaining an oscillation frequency to be constant with respect to a temperature change.

The temperature characteristic of an oscillation frequency greatly varies for each product sample. Thus, in inspection steps of manufacturing and shipment of a product (oscillator), the temperature characteristic of an oscillation frequency or the change characteristic of temperature detection data corresponding to the ambient temperature is measured. Coefficients $A_0$ to $A_5$ of a polynomial (approximate function) in the following Equation (5) are obtained on the basis of measurement results, and information regarding the obtained coefficients $A_0$ to $A_5$ is written and stored in the storage 34 (nonvolatile memory) illustrated in FIG. 2.

$$TCODE = A_5 \cdot X^5 + A_4 \cdot X^4 + A_3 \cdot X^3 + A_2 \cdot X^2 + A_1 \cdot X^1 + A_0 \quad (5)$$

In the above Equation (5), X corresponds to the temperature detection data DTD (A/D conversion value) obtained by the A/D converter 20. Since a change in the temperature detection data DTD with respect to a change in the ambient temperature is also measured, the ambient temperature and an oscillation frequency can be correlated with each other by using the approximate function shown in the polynominal in the above Equation (5). The temperature compensator 58 reads the information regarding the coefficients $A_0$ to $A_5$ from the storage 34, and performs a calculation process using the Equation (5) on the basis of the coefficients $A_0$ to $A_5$ and the temperature detection data DTD (=X), so as to generate the temperature compensation data TCODE (temperature compensation code). Consequently, it is possible to realize a temperature compensation process for maintaining an oscillation frequency to be constant with respect to a change in the ambient temperature.

Each of the selectors 62 and 63 selects an input signal which is input to a terminal "1" in a case where a logic level of an input signal which is input to a select terminal S is "1" (active), and outputs the selected input signal as an output signal. Each of the selectors 62 and 63 selects an input signal which is input to a terminal "0" in a case where a logic level of an input signal which is input to a select terminal S is "0" (inactive), and outputs the selected input signal as an output signal.

A signal KFEN is an enable signal of a Karman filter process. The Karman filter 54 performs a Karman filter process in a case where the signal KFEN has a logic level of "1" (hereinafter, simply referred to as "1"). The signal PLLLOCK has "1" in a case where the PLL circuit is in a lock state. The signal HOLDOVER has "1" in a hold-over period in which a hold-over state is detected.

A signal TCEN is an enable signal of a temperature compensation process. As an example, a description will be made focusing on a case where the signal TCEN has "1", and the selector 63 selects an input signal which is input to the terminal "1". The signal KFEN is assumed to also have "1".

In a normal operation period, the signal HOLDOVER has a logic level of "0" (hereinafter, simply referred to as "0"), and thus the selector 62 selects the frequency control data DFCI on the terminal "0" side. The temperature compensation data TCODE is added to the frequency control data DFCI by the adder 65, and the frequency control data DFCQ having undergone a temperature compensation process is output to the oscillation signal generation circuit 140 in the subsequent stage.

On the other hand, in a hold-over period, the signal HOLDOVER has "1", and thus the selector 62 selects AC(k) on the terminal "1" side. AC(k) indicates frequency control data having undergone aging correction.

Figures 25, 26:
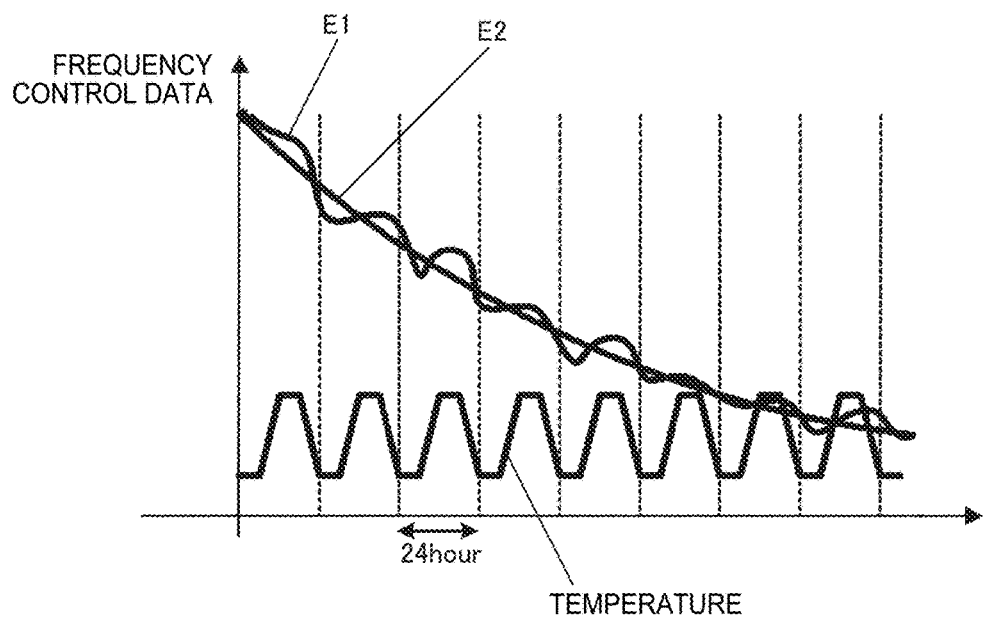
FIG. 25 is a diagram illustrating an operation of the processor.
FIG. 26 is a diagram illustrating an operation of the processor.

FIG. 25 is a truth value table for explaining an operation of the Karman filter 54. In a case where both of the signals PLLLOCK and KFEN have "1", the Karman filter 54 performs a true value estimation process (Karman filter process). In other words, in a case where the PLL circuit (internal or external PLL circuit) is in a lock state, a true value estimation process of the frequency control data DFCI which is an observed value is continuously performed.

In a case where a hold-over state occurs, thus the PLL circuit is unlocked, and thus the signal PLLLOCK has "0", the Karman filter 54 holds the previous output state. For example, in FIG. 24, the post-estimated value x^(k) estimated as a true value of the frequency control data DFCI, or a value at a detection timing (a timing at which unlocking of the PLL circuit occurs) of the hold-over state as the correction value D'(k) for aging correction is held, and is continuously output.

The aging corrector 56 performs aging correction by using the post-estimated value x^(k) and the correction value D'(k) from the Karman filter 54 in the hold-over period. Specifically, the post-estimated value x^(k) and the correction value D'(k) at the detection timing of the hold-over state are held, and the aging correction is performed.

In FIG. 24, of a temperature change component (in a broad sense, an environmental change component) and an aging change component, the frequency control data DFCI from which the temperature change component is removed is input to the Karman filter 54. The Karman filter 54 performs a Karman filter process on the frequency control data DFCI from which the temperature change component (environmental change component) is removed, and thus a true value of the frequency control data DFCI is estimated. In other words, the post-estimated value x^(k) is obtained. The aging corrector 56 performs aging correction on the basis of the post-estimated value x^(k) which is the estimated true value. More specifically, the frequency control data AC(k) having undergone the aging correction is obtained on the basis of the post-estimated value x^(k) and the correction value D'(k) from the Karman filter 54. The frequency control data AC(k) having undergone the aging correction is input to the adder 65 via the selector 62, and the adder 65 performs a process of adding the temperature compensation data TCODE (data for compensating for the environmental change component) to the frequency control data AC(k).

For example, as illustrated in a schematic diagram of FIG. 26, if a temperature changes, frequency control data also changes according thereto as indicated by E1. Therefore, if a Karman filter process is performed by using the frequency control data which changes according to a temperature change as indicated by E1, a true value at a hold-over detection timing also fluctuates.

Therefore, in the present embodiment, frequency control data from which the temperature change component is removed is acquired, and is input to the Karman filter 54. In other words, of the temperature change component (environmental change component) and the aging change component, the frequency control data from which the temperature change component is removed is input to the Karman filter 54. In other words, frequency control data as indicated by E2 in FIG. 26 is input. The frequency control data indicated by E2 is obtained by removing the temperature change component, and is thus frequency control data in which the aging change component remains.

The Karman filter 54 performs a Karman filter process on the frequency control data DFCI from which the temperature change component is removed and in which the aging change component remains as mentioned above, so as to obtain the post-estimated value x^(k) estimated as a true value or the correction value D'(k) for aging correction. The post-estimated value x^(k) which is a true value at the hold-over detection timing, or the correction value D'(k) is held in the aging corrector 56, and aging correction is performed.

For example, the adder 65 performs a process of adding the temperature compensation data TCODE to the frequency control data DFCQ, and thus the frequency control data DFCQ becomes temperature-compensated frequency control data. Therefore, the oscillation signal generation circuit 140 to which the frequency control data DFCQ is input outputs the oscillation signal OSCK having a temperature-compensated oscillation frequency. Therefore, the frequency control data generator 40 (or the external frequency control data generator 200; the same applies hereinafter) illustrated in FIG. 2 forming the PLL circuit along with the oscillation signal generation circuit 140 supplies the frequency control data DFCI from which the temperature change component is removed as indicated by E2 in FIG. 26, to the processor 50. The aging change component which changes over time remains in the frequency control data DFCI from which the temperature change component is removed as indicated by E2 in FIG. 26. Therefore, if the Karman filter 54 of the processor 50 performs a Karman filter process on the frequency control data DFCI in which the aging change component remains, and the aging corrector 56 performs aging correction on the basis of a result of the Karman filter process, it is possible to realize highly accurate aging correction.

As a modification example of the configuration illustrated in FIG. 24, a calculation process for removing the temperature change component (environmental change component) of the frequency control data DFCI may be performed without performing a process of adding the temperature compensation data TCODE in the adder 65, and the frequency control data DFCI having undergone the calculation process may be input to the Karman filter 54. For example, the configuration of the adder 65 and the selector 63 in FIG. 17 is omitted, a subtractor which subtracts the temperature compensation data TCODE from the frequency control data DFCI is provided in the previous stage of the Karman filter 54, and an output from the subtractor is input to the Karman filter 54. An adder which adds an output from the aging corrector 56 to the temperature compensation data TCODE is provided between the aging corrector 56 and the selector 62, and an output from the adder is input to the terminal "1" of the selector 62. Also with this configuration, the frequency control data DFCI from which the temperature change component can be removed and in which only the aging change component remains can be input to the Karman filter 54.

Figure 27:
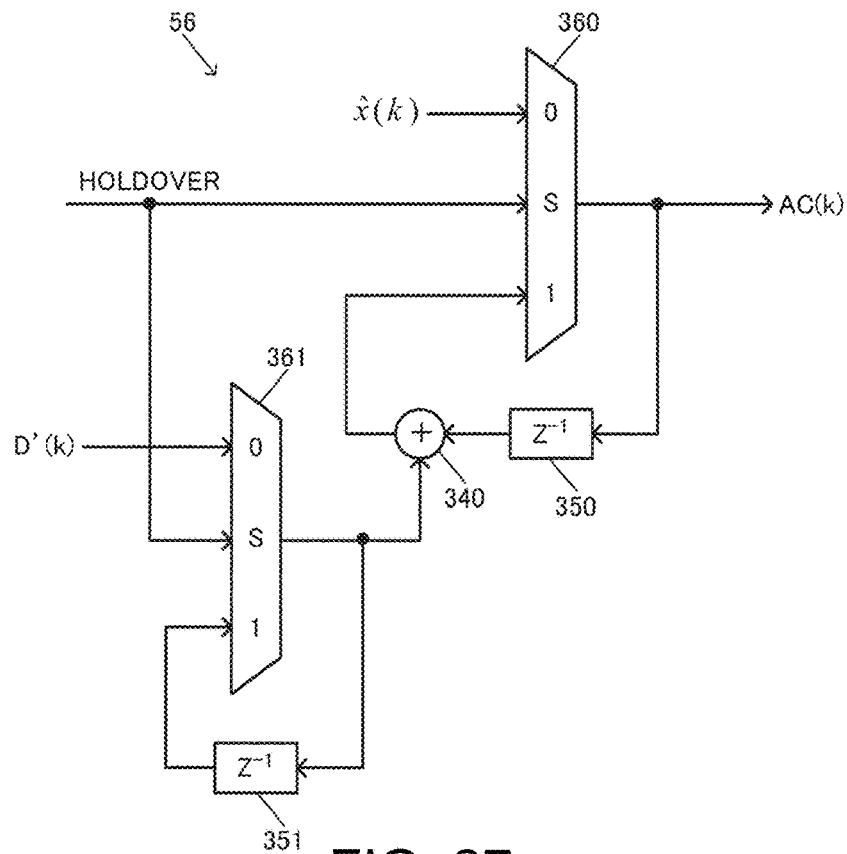
FIG. 27 is a diagram illustrating a configuration example of an aging corrector.

FIG. 27 illustrates a detailed configuration example of the aging corrector 56. In a normal operation period, since the signal HOLDOVER has "0", selectors 360 and 361 select terminal "0" sides. Consequently, in the normal operation period, the post-estimated value x^(k) and the correction value D'(k) (a correction value having undergone a filter process) calculated by the Karman filter 54 are respectively held in registers 350 and 351.

If a hold-over state is detected, and the signal HOLDOVER has "1", the selectors 360 and 361 select terminal "1" sides. Consequently, the selector 361 continuously outputs the correction value D'(k) held in the register 351 at the hold-over detection timing during a hold-over period.

An adder 340 performs a process of sequentially adding the correction value D'(k) (correction value) which is held in the register 351 and is output from the selector 361, to the post-estimated value x^(k) held in the register 350 at the hold-over detection timing, for each time step. Consequently, aging correction as expressed by the following Equation (6) is realized.

$$AC(k+1)=AC(k)+D'(k) \quad (6)$$

In other words, the aging correction is realized by sequentially adding the correction value D'(k) for canceling (compensating for) a frequency change at an aging rate corresponding to the inclination indicated by C3, to the post-estimated value x^(k) which is a true value held in the timing C2 in FIG. 22.

10. Karman Filter Process

Next, the Karman filter process of the present embodiment will be described in detail. A state equation and an observation equation of a Karman filter model are expressed as in the following Equations (7) and (8).

$$x(k+1)=A \cdot x(k)+v(k) \quad (7)$$

$$y(k)=C^T \cdot x(k)+w(k) \quad (8)$$

Here, k indicates a time step which is a discrete time. In addition, x(k) indicates a state of a system at a time step k (time point k), and is, for example, an n-dimensional vector. A is called a system matrix. Specifically, A is a matrix of n×n, and correlates a state of the system at the time step k with a state of the system at a time step k+1 in a case where there is no system noise. Further, v(k) indicates system noise. Furthermore, y(k) indicates an observed value, and w(k) indicates observed noise. C indicates an observation coefficient vector (n dimensions), and T indicates a transposed matrix.

In a Karman filter process on the model expressed by the above Equations (7) and (8), a process using the following Equations (9) to (13) is performed so that a true value is estimated.

$$\hat{x}^-(k) = A\hat{x}(k-1) \tag{9}$$

$$P^-(k) = A \cdot P(k-1) \cdot A^T + v(k) \tag{10}$$

$$G(k) = \frac{P^-(k) \cdot C}{C^T \cdot P^-(k) \cdot C + w(k)} \tag{11}$$

$$\hat{x}(k) = \hat{x}^-(k) + G(k) \cdot (y(k) - C^T \cdot \hat{x}^-(k)) \tag{12}$$

$$P(k) = (1 - G(k) \cdot C^T) \cdot P^-(k) \tag{13}$$

$\hat{x}(k)$: post-estimated value
$\hat{x}^-(k)$: pre-estimated value
$P(k)$: post-covariance
$P^-(k)$: pre-covariance
$G(k)$ Karman gain The above Equations (9) and (10) are equations regarding the time update (prediction process), and the above Equations (11) to (13) are equations regarding the observation update (observation process). Whenever the single time step k as a discrete time progresses, each of the time update (Equations (9) and (10)) and the observation update (Equations (11) to (13)) of the Karman filter process is performed once.

Here, $\hat{x}(k)$ and $\hat{x}(k-1)$ are post-estimated values at time steps k and k−1. In addition, $\hat{x}^-(k)$ is a pre-estimated value predicted before an observed value is obtained. P(k) is a post-covariance in the Karman filter process, and $P^-(k)$ is a pre-covariance predicted before an observed value is obtained. G(k) is a Karman gain.

In the Karman filter process, the Karman gain G(k) is obtained according to the above Equation (11) during the observation update. The post-estimated value $\hat{x}(k)$ is updated according to the above Equation (12) on the basis of the observed value y(k). The post-covariance P(k) of errors is updated according to the above Equation (13).

In the Karman filter, during the time update, as shown in the above Equation (9), the pre-estimated value $\hat{x}^-(k)$ at the next time step k is predicted on the basis of the post-estimated value $\hat{x}(k-1)$ at the time step k−1 and the system matrix A. As shown in the above Equation (10), the pre-covariance $P^-(k)$ at the next time step k is predicted on the basis of the post-covariance P(k−1) at the time step k−1, the system matrix A, and the system noise v(k).

Meanwhile, if a Karman filter process using the above Equations (9) to (13) is to be performed, a processing load on the processor 50 is excessive, and thus a size of the circuit device may increase. For example, in order to obtain A of $\hat{x}^-(k) = A\hat{x}(k-1)$ in the above Equation (9), an extended Karman filter process is required to be performed. The extended Karman filter process requires a considerable processing load, and if the processor 50 is implemented by hardware being capable of performing the extended Karman filter process, a circuit area of the processor 50 tends to increase. Thus, this is not appropriate in a situation in which the circuit device built into an oscillator is strongly required to be small-sized. On the other hand, if fixed scalar values are used as the system matrix A, it is difficult to realize appropriate aging correction.

Therefore, in order to solve this problem, in the present embodiment, the Karman filter process is performed according to the following Equations (14) to (19) instead of the above Equations (9) to (13). In other words, the processor 50 (Karman filter 54) performs a Karman filter process based on the following Equations (14) to (19).

$$\hat{x}^-(k) = \hat{x}(k-1) + D(k-1) \tag{14}$$

$$P^-(k) = P(k-1) + v(k) \tag{15}$$

$$G(k) = \frac{P^-(k)}{P^-(k) + w(k)} \tag{16}$$

$$\hat{x}(k) = \hat{x}^-(k) + G(k) \cdot (y(k) - \hat{x}^-(k)) \tag{17}$$

$$P(k) = (1 - G(k)) \cdot P^-(k) \tag{18}$$

$$D(k) = D(k-1) + E \cdot (y(k) - \hat{x}^-(k)) \tag{19}$$

In the present embodiment, since x(k) as a true value estimation processing target is frequency control data, and the observed value y(k) is also frequency control data, C becomes 1. A scalar value of A is infinitely near 1, and thus the above Equation (15) may be used instead of the above Equation (10).

As described above, compared with a case of using an extended Karman filter process as the Karman filter process, in the Karman filter process of the present embodiment, as shown in the above Equation (14), the pre-estimated value $\hat{x}^-(k)$ at the time step k is obtained by adding the post-estimated value $\hat{x}(k-1)$ and the correction value D(k−1) at the time step k−1 together. Thus, it is not necessary to use the extended Karman filter process, and thus the Karman filter process of the present embodiment is excellent in that it is possible to reduce a processing load on the processor 50 or to suppress an increase in a circuit size.

In the present embodiment, the above Equation (14) is derived through modifications as follows.

$$\hat{x}^-(k) = A\hat{x}(k-1) \tag{20}$$

$$= \hat{x}(k-1) + (A-1) \cdot \hat{x}(k-1) \tag{21}$$

$$\approx \hat{x}(k-1) + (A-1) \cdot F_0 \tag{22}$$

$$= \hat{x}(k-1) + D(k-1) \tag{23}$$

For example, the above Equation (20) may be modified into the above Equation (21). Here, (A−1) in the above Equation (21) is a considerably small number, and thus $(A-1) \cdot \hat{x}(k-1)$ can be replaced with $(A-1) \cdot F_0$ so as to be approximated as shown in the above Equations (22) and (23). $(A-1) \cdot F_0$ is set to the correction value D(k−1).

As shown in the above Equation (19), during the time update from the time step k−1 to the time step k, a process of updating the correction value $D(k) = D(k-1) + E \cdot (y(k) - \hat{x}^-(k)) = D(k-1) + E \cdot ek$ is performed. Here, $ek = y(k) - \hat{x}^-(k)$ is called an observation residual in the Karman filter process. In addition, E is a constant. A modification may occur so that the Karman gain G(k) is used instead of the constant E. In other words, $D(k) = D(k-1) + G(k) \cdot ek$ may be used.

As mentioned above, in Equation (19), the correction value D(k) is obtained according to $D(k) = D(k-1) + E \cdot ek$ by using the observation ek and the constant E. In the above-described way, it is possible to perform a process of updating the correction value D(k) in which the observation residual ek is reflected in the Karman filter process.

As described above, in the present embodiment, as shown in the above Equation (14), the processor 50 performs a process of obtaining the pre-estimated value $\hat{x}^-(k)$ at the present timing by adding the post-estimated value $\hat{x}(k-1)$ and the correction value $D(k-1)$ at the previous timing together, in a process of updating (time update) a pre-estimated value during the Karman filter process. The aging correction is performed on the frequency control data on the basis of results of the Karman filter process. In other words, the post-estimated value $\hat{x}(k-1)$ and the correction value $D(k-1)$ at the time step k−1 which is the previous timing are added together, and thus the pre-estimated value $\hat{x}^-(k)$ at the time step k which is the present timing is obtained according to $\hat{x}^-(k)=\hat{x}(k-1)+D(k-1)$.

The processor 50 (aging corrector 56) performs the aging correction on the basis of results (the true value and the correction value) of the Karman filter process. In other words, in a case where a correction value at the time step k is indicated by $D(k)$ (or $D'(k)$), and frequency control data having undergone aging correction at the time step k is indicated by $AC(k)$, frequency control data $AC(k+1)$ having undergone aging correction at the time step k+1 is obtained according to $AC(k+1)=AC(k)+D(k)$ (or $AC(k)+D'(k)$).

As shown in the above Equation (19), the processor 50 obtains the correction value $D(k)$ at the present timing by using the correction value $D(k-1)$ at the previous timing and the observation residual ek in the Karman filter process. For example, E·ek (or G(k)·ek) based on the observation residual is added to the correction value $D(k-1)$ at the previous timing, and thus the correction value $D(k)$ at the present timing is obtained. Specifically, the correction value $D(k)$ at the time step k which is the present timing is obtained by using the correction value $D(k-1)$ at the time step k−1 which is the previous timing and the observation residual ek in the Karman filter process. For example, the correction value $D(k)$ is obtained according to $D(k)=D(k-1)+E·ek$ by using the observation residual ek and the constant E.

For example, in the present embodiment, as described with reference to FIG. 26, environmental change component information such as temperature change component information is acquired, and frequency control data from which the environmental change component is removed of the environmental change component and the aging change component is acquired by using the acquired environmental change component information. Here, the environmental change component information may be, for example, a power supply voltage change component, an atmospheric pressure change component, or a gravity change component. Aging correction is performed on the basis of the frequency control data from which the environmental change component is removed. Specifically, it is assumed that the environmental change component is a temperature. In this case, the temperature change component information which is environmental change component information is acquired on the basis of the temperature detection data DTD which is obtained by using a temperature detection voltage VTD from the temperature sensor 10 illustrated in FIG. 2 as an environmental change information acquirer which acquires environmental change component information. Frequency control data from which the temperature change component is removed is acquired by using the acquired temperature change component information. For example, the temperature compensation data TCODE is acquired by the temperature compensator 58 illustrated in FIG. 24, so as to be added by the adder 65, and thus the frequency control data DFCI from which the temperature change component is removed is input from the frequency control data generator 40 (or the external frequency control data generator 200) so as to be acquired by the processor 50. In other words, as indicated by E2 in FIG. 26, the frequency control data DFCI from which the temperature change component is removed and in which the aging change component remains is acquired, and is input to the Karman filter 54.

The frequency control data from which the environmental change component is removed includes not only frequency control data in a preferable state in which the environmental change component is completely removed therefrom but also frequency control data in a state in which the environmental change component with a negligible level is included in the frequency control data.

For example, environmental change component information such as temperature change component information or power supply voltage change information may be acquired by a temperature sensor, a voltage detection circuit, or the like as an environmental change information acquirer detecting environmental change component information. On the other hand, the aging change component is a change component of an oscillation frequency which changes over time, and it is difficult to directly obtain information regarding the aging change component by using a sensor or the like.

Therefore, in the present embodiment, environmental change component information such as temperature change component information which can be detected by a sensor or the like is acquired, and frequency control data from which the environmental change component is removed of the environmental change component and the aging change component is acquired by using the environmental change component information. In other words, a process (for example, an addition process in the adder 65) of removing the environmental change component from the change components of frequency control data is performed, and thus frequency control data in which only the aging change component remains can be acquired as indicated by E2 in FIG. 26. If a Karman filter process or the like is performed on the basis of the frequency control data in which the aging change component remains, a true value of the frequency control data can be estimated. If aging correction is performed on the basis of the true value estimated in the above-described way, it is possible to realize highly accurate aging correction which cannot be realized in examples of the related art.

As mentioned above, in the present embodiment, the frequency control data DFCI from which the temperature change component (environmental change component) is removed and in which the aging change component remains is input to the Karman filter 54. As illustrated in FIGS. 19 and 22, if a period is restricted, it may be expected that an oscillation frequency changes at a constant aging rate in the period. For example, it may be expected that an oscillation frequency changes with a constant inclination as indicated by C3 in FIG. 22.

In the present embodiment, a correction value for compensating for (canceling) the frequency change at the constant aging rate due to the aging change component is obtained according to $D(k)=D(k-1)+E·ek$. In other words, the correction value $D(k)$ for compensating for the frequency change at an aging rate corresponding to the inclination indicated by C3 in FIG. 22 is obtained. Here, the aging rate is not constant, and changes over time as illustrated in FIGS. 19 and 22.

In relation to this fact, in the present embodiment, a process of updating the correction value $D(k)$ corresponding to an aging rate is performed on the basis of the observation residual $ek=y(k)-\hat{x}^-(k)$ in the Karman filter process, such as D(k)=D(k−1)+E·ek. Therefore, it is possible to realize an update process on the correction value D(k) in which a change in an aging rate according to the elapsed time is also reflected. Therefore, it is possible to realize more highly accurate aging correction.

11. Modification Examples

Figure 28:
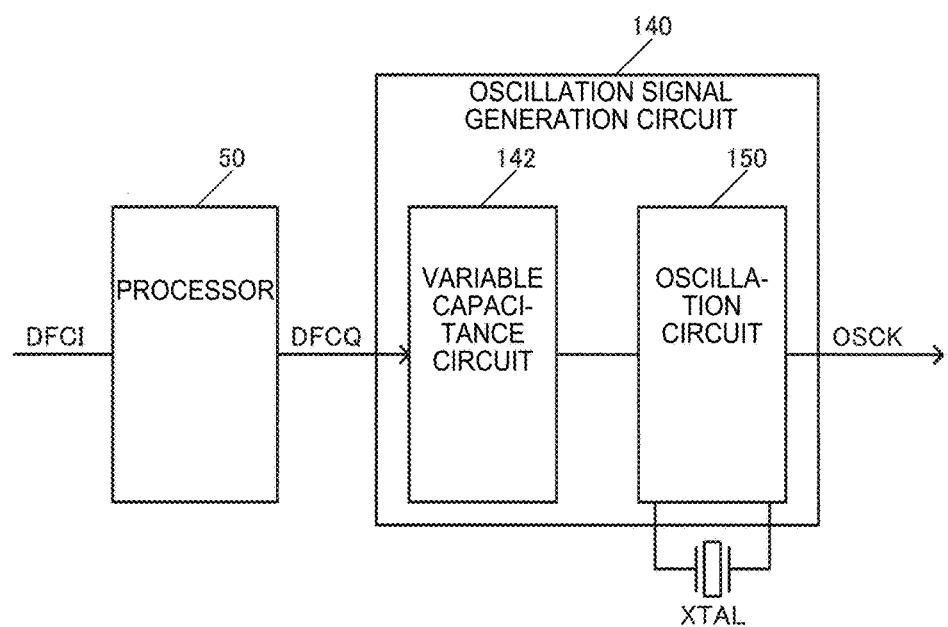
FIG. 28 is a diagram for explaining a modification example of the present embodiment.

Next, various modification examples of the present embodiment will be described. FIG. 28 illustrates a configuration example of a circuit device according to a modification example of the present embodiment.

In FIG. 28, the D/A converter 80 is not provided in the oscillation signal generation circuit 140 unlike in FIGS. 1 and 2. An oscillation frequency of the oscillation signal OSCK generated by the oscillation signal generation circuit 140 is directly controlled on the basis of the frequency control data DFCQ from the processor 50. In other words, an oscillation frequency of the oscillation signal OSCK is controlled without using the D/A converter.

For example, in FIG. 28, the oscillation signal generation circuit 140 a variable capacitance circuit 142 and an oscillation circuit 150. The oscillation signal generation circuit 140 is not provided with the D/A converter 80 illustrated in FIGS. 1 and 2. The variable capacitance circuit 142 is provided instead of the variable capacitance capacitor CX1 illustrated in FIG. 14, and one end of the variable capacitance circuit 142 is connected to one end of the resonator XTAL.

A capacitance value of the variable capacitance circuit 142 is controlled on the basis of the frequency control data DFCQ from the processor 50. For example, the variable capacitance circuit 142 is provided with a plurality of capacitors (capacitor array), and a plurality of switch elements (switch array) each of which allows turning-on and turning-off to be controlled on the basis of the frequency control data DFCQ. Each of the plurality of switch elements is electrically connected to each of the plurality of capacitors. The plurality of switch elements are turned on or off, and thus the number of capacitors whose one ends are connected to one end of the resonator XTAL among the plurality of capacitors changes. Consequently, a capacitance value of the variable capacitance circuit 142 is controlled, and thus a capacitance value of the resonator XTAL changes. Therefore, a capacitance value of the variable capacitance circuit 142 can be directly controlled by the frequency control data DFCQ, and thus an oscillation frequency of the oscillation signal OSCK can be controlled.

12. Oscillator, Electronic Apparatus, and Vehicle

Figure 29:
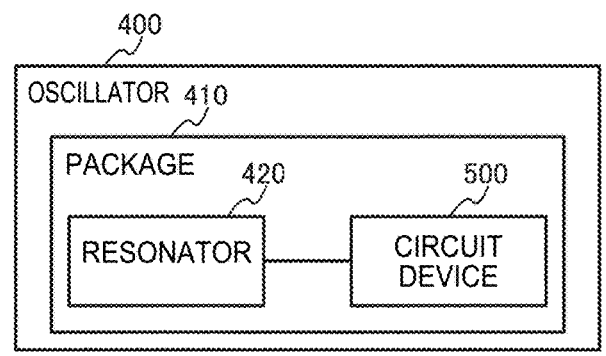
FIG. 29 is a diagram illustrating a configuration example of an oscillator.

FIG. 29 illustrates a configuration example of an oscillator 400 provided with the circuit device 500 of the present embodiment. As illustrated in FIG. 29, the oscillator 400 includes a resonator 420 and the circuit device 500. The resonator 420 and the circuit device 500 are mounted in a package 410 of the oscillator 400. A terminal of the resonator 420 is electrically connected to a terminal (pad) of the circuit device 500 (IC) via an internal wiring of the package 410.

Figure 30:
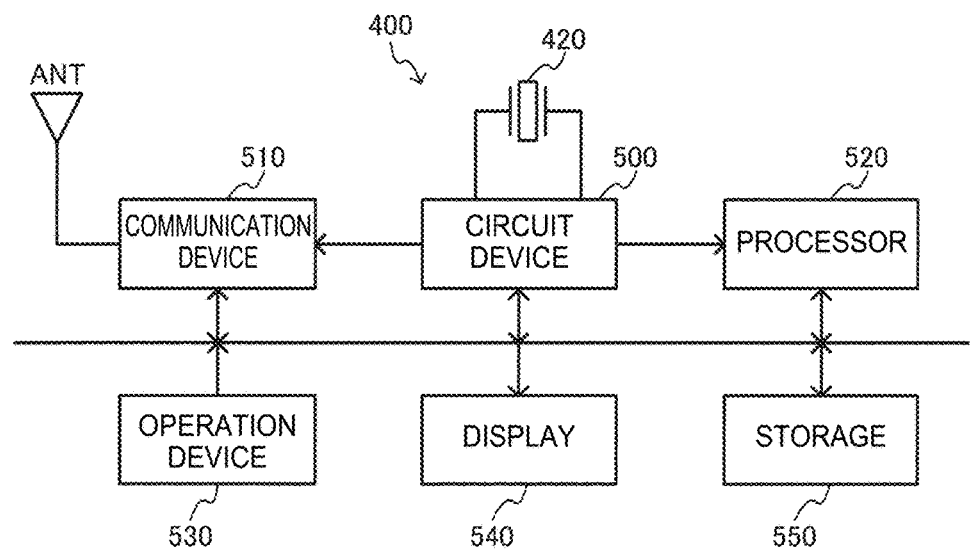
FIG. 30 is a diagram illustrating a configuration example of an electronic apparatus.

FIG. 30 illustrates a configuration example of an electronic apparatus including the circuit device 500 of the present embodiment. The electronic apparatus includes the circuit device 500 of the present embodiment, the resonator 420 such as a quartz crystal resonator, an antenna ANT, a communication device 510, a processor 520, and the like. The electronic apparatus may include an operation device 530, a display 540, and a storage 550. The oscillator 400 is formed of the resonator 420 and the circuit device 500. A configuration of the electronic apparatus is not limited to the configuration illustrated in FIG. 30, and may be variously modified by omitting some constituent elements or adding other constituent elements thereto.

As the electronic apparatus illustrated in FIG. 30, there may be various apparatuses, for example, a network related apparatus such as a base station or a router, a highly accurate measurement apparatus, a GPS built-in clock, a wearable apparatus such as a biological information measurement apparatus (a sphygmograph, a pedometer, or the like) or a head mounted display, a portable information terminal (mobile terminal) such as a smart phone, a mobile phone, a portable game apparatus, a notebook PC, or a tablet PC, a content providing terminal which delivers content, and a video apparatus such as a digital camera or a video camera.

The communication device 510 (wireless circuit) performs a process of receiving data from an external apparatus or transmitting data to the external apparatus, via the antenna ANT. The processor 520 performs a process of controlling the electronic apparatus, or various digital processes on data which is transmitted and received via the communication device 510. The function of the processor 520 may be realized by, for example, a processor such as a microcomputer.

The operation device 530 is used for a user to perform an input operation, and may be implemented by, for example, an operation button or a touch panel display. The display 540 displays various pieces of information, and may be implemented by, for example, a liquid crystal display or an organic EL display. In a case where a touch panel display is used as the operation device 530, the touch panel display also functions as the operation device 530 and the display 540. The storage 550 stores data, and a function thereof may be realized by a semiconductor memory such as a RAM or a ROM, or a hard disk drive (HDD).

Figure 31:
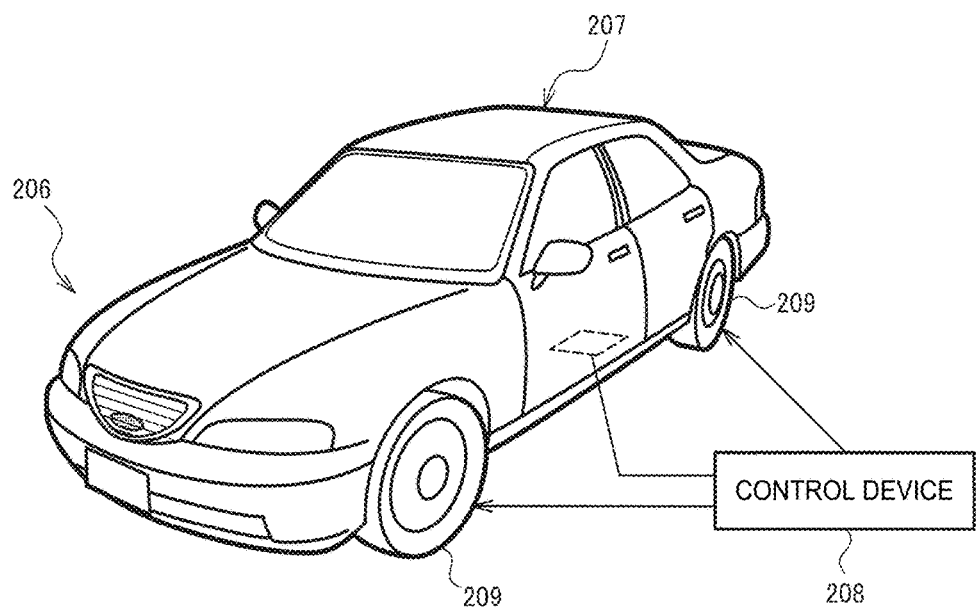
FIG. 31 is a diagram illustrating a configuration example of a vehicle.

FIG. 31 illustrates an example of a vehicle including the circuit device of the present embodiment. The circuit device (oscillator) of the present embodiment may be incorporated into, for example, various vehicles such as a car, an aircraft, a motorbike, a bicycle, and a ship. The vehicles are pieces of equipment or instruments which are provided with, for example, driving mechanisms such as engines or motors, steering mechanisms such as handles or rudders, and various electronic apparatuses (on-vehicle apparatuses), and move on the ground, in the air, and in the sea. FIG. 31 schematically illustrates an automobile 206 as a specific example of the vehicle. The oscillator (not illustrated) including the circuit device and the resonator of the present embodiment is incorporated into the automobile 206. A control device 208 operates on the basis of a clock signal generated by the oscillator. The control device 208 controls hardness and softness of a suspension or a brake of each car wheel 209, for example, in accordance with the attitude of a car body 207. For example, automatic driving of the automobile 206 may be realized by the control device 208. An apparatus into which the circuit device or the oscillator of the present embodiment is incorporated is not limited to the control device 208, and the circuit device or the oscillator of the present embodiment may be incorporated into various apparatuses (on-vehicle apparatuses) provided in a vehicle such as the automobile 206.

Figure 32:
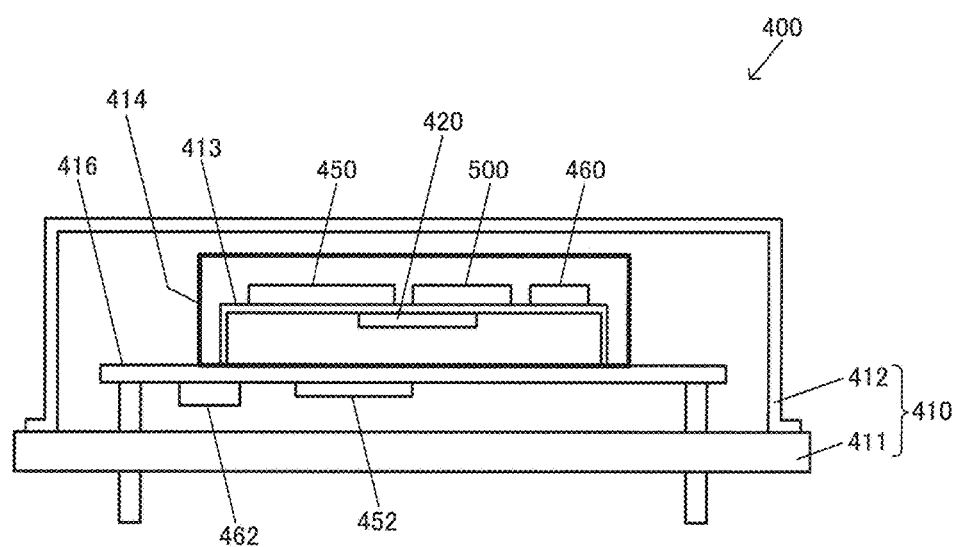
FIG. 32 is a diagram illustrating a detailed structure example of the oscillator.

FIG. 32 illustrates a detailed structure example of the oscillator 400. The oscillator 400 illustrated in FIG. 32 is an oscillator having a double oven structure (in a broad sense, an oven structure).

The package 410 is formed of a board 411 and a case 412. Various electronic components (not illustrated) are mounted on the board 411. A second container 414 is provided inside the case 412, and a first container 413 is provided inside the second container 414. The resonator 420 is mounted on an inner surface (lower side surface) of an upper surface of the first container 413. The circuit device 500 of the present embodiment, a heater 450, and a temperature sensor 460 are mounted on an outer surface (upper side surface) of the upper surface of the first container 413. For example, the temperature of the inside of the second container 414 can be adjusted by using the heater 450 (heat generation element). For example, the temperature of the inside of the second container 414 can be detected by using the temperature sensor 460.

The second container 414 is provided on a board 416. The board 416 is a circuit board on which various electronic components can be mounted. In the board 416, a heater 452 and a temperature sensor 462 are mounted on a rear side surface opposite to the surface on which the second container 414 is provided. For example, the temperature of a space between the case 412 and the second container 414 can be adjusted by using the heater 452 (heat generation element). The temperature of the space between the case 412 and the second container 414 can be detected by using the temperature sensor 462.

As heat generation elements of the heaters 450 and 452, for example, a heat generation power bipolar transistor, a heat generation heater MOS transistor, a heat generation resistor, or a Peltier element. Heat generation of the heaters 450 and 452 may be controlled by, for example, an oven controlled circuit of the circuit device 500. As the temperature sensors 460 and 462, for example, a thermistor, a diode, or the like may be used.

In FIG. 32, the temperature of the resonator 420 or the like can be adjusted with a thermostatic oven having a double oven structure, and thus it is possible to stabilize an oscillation frequency of the resonator 420.

FIG. 33 illustrates a configuration example of a base station (base station apparatus) which is one of the electronic apparatuses. A physical layer circuit 600 performs a process on a physical layer in a communication process using a network. A network processor 602 performs a process on a higher-order layer (a link layer or the like) than the physical layer. A switch 604 performs various switching processes in the communication process. A DSP 608 performs various digital signal processes which are necessary in the communication process. An RF circuit 608 includes a reception circuit formed of a low noise amplifier (LNA), a transmission circuit formed of a power amplifier, a D/A converter, an A/D converter, and the like.

A selector 612 outputs either a reference signal RFCK1 from a GPS 610 or a reference signal RFCK2 (a clock signal from the network) from the physical layer circuit 600, to the circuit device 500 of the present embodiment as the reference signal RFCK. The circuit device 500 performs a process of synchronizing an oscillation signal (an input signal based on the oscillation signal) with the reference signal RFCK. Various clock signals CK1, CK2, CK3, CK4 and CK5 having different frequencies are generated, and are supplied to the physical layer circuit 600, the network processor 602, the switch 604, and the DSP 606, and the RF circuit 608.

According to the circuit device 500 of the present embodiment, in a base station as illustrated in FIG. 33, an oscillation signal can be synchronized with the reference signal RFCK, and the clock signals CK1 to CK5 having the high frequency stability, generated on the basis of the oscillation signal, can be supplied to the respective circuits of the base station.

Although the one or more embodiments have been described as above in detail, it can be easily understood by a person skilled in the art that various modifications without substantially departing from the new matters and effects of the one or more embodiments of the invention are possible. Therefore, these modifications are all included in the scope of the various embodiments of the invention. For example, in the specification or the drawings, the terminologies (for example, a temperature change component) which are mentioned at least once along with different terminologies (for example, a environmental change component) which have broader meanings or the same meanings may be replaced with the different terminologies in any location of the specification or the drawings. All combinations of the one or more embodiments and the modification examples are included in the scope of the various embodiments of the invention. In addition, configurations, operations, and the like of the circuit device, the oscillator, the electronic apparatus, and the vehicle, the technique of arranging circuit blocks or terminals, or the aging correction process, the Karman filter process, the hold-over process, the temperature compensation process, and the like are also not limited to the above description of the one or more embodiments, and may have various modifications.

What is claimed is:

1. A circuit device comprising:
    a digital interface;
    a processor that is connected to the digital interface;
    an oscillation signal generation circuit that generates an oscillation signal by using data from the processor and a resonator;
    a clock signal generation circuit that generates a clock signal having a frequency which is obtained through multiplication of an oscillation frequency of the oscillation signal;
    a terminal group of the digital interface, disposed in a first region along a first side of the circuit device; and
    a terminal group of the clock signal generation circuit, disposed in any one of a second region along a second side of the circuit device that intersects the first side, a third region along a third side of the circuit device that opposes the first side, and a fourth region along a fourth side of the circuit device that opposes the second side.

2. The circuit device according to claim 1, further comprising:
    a terminal group of the oscillation signal generation circuit, disposed in the second region.

3. The circuit device according to claim 2,
    wherein the terminal group of the clock signal generation circuit is disposed in the third region.

4. The circuit device according to claim 1,
    wherein the first side is a short side of the circuit device.

5. The circuit device according to claim 2,
    wherein, at least one of a distance L12 between the terminal group of the digital interface and the terminal group of the oscillation signal generation circuit and a distance L13 between the terminal group of the digital interface and the terminal group the clock signal generation circuit, is longer than a distance L23 between the terminal group of the oscillation signal generation circuit and the terminal group of the clock signal generation circuit.

6. The circuit device according to claim 1,
    wherein frequency control data from an external device is input to the processor via the terminal group for connection of the digital interface, and the digital interface, the external device being a device that compares an input signal based on the oscillation signal with a reference signal, wherein the processor is configured to perform a signal process on the frequency control data to output processed frequency control data, and wherein the oscillation signal generation circuit generates the oscillation signal on the basis of the processed frequency control data.

7. The circuit device according to claim 6, further comprising:

a phase comparator that compares a phase of an input signal based on the oscillation signal with a phase of the reference signal, wherein the oscillation signal generation circuit generates the oscillation signal on the basis of the frequency control data from the external device in a first mode, and generates the oscillation signal on the basis of the frequency control data from the phase comparator in a second mode.

8. The circuit device according to claim 1, wherein the digital interface is a 2-wire, 3-wire, or 4-wire serial interface circuit including a serial data line and a serial clock line.

9. The circuit device according to claim 1, wherein the processor is disposed between the first region and the clock signal generation circuit.

10. The circuit device according to claim 9, wherein the oscillation circuit is disposed between the processor and the clock signal generation circuit.

11. The circuit device according to claim 1, further comprising:

a terminal group that is disposed in the fourth region and includes an oven control terminal of an oven type oscillator comprising the resonator and a thermostatic oven.

12. The circuit device according to claim 11, further comprising:

an oven control circuit that is connected to the oven control terminal and controls the oven of the oven type oscillator.

13. The circuit device according to claim 12, wherein the oscillation circuit is disposed between the oven control circuit and the second region.

14. An oscillator comprising:

a resonator; and a circuit device including a digital interface;

a processor that is connected to the digital interface;

an oscillation signal generation circuit that generates an oscillation signal by using data from the processor and a resonator;

a clock signal generation circuit that generates a clock signal having a frequency which is obtained through multiplication of an oscillation frequency of the oscillation signal;

a terminal group of the digital interface, disposed in a first region along a first side of the circuit device; and p2 a terminal group of the clock signal generation circuit, disposed in any one of a second region along a second side of the circuit device that intersects the first side, a third region along a third side of the circuit device that opposes the first side, and a fourth region along the fourth side of the circuit device that opposes the second side.

15. An electronic apparatus comprising the circuit device according to claim 1.

16. A vehicle comprising the circuit device according to claim 1.

* * * * *